United States Patent
Kim et al.

(10) Patent No.: US 10,157,674 B2
(45) Date of Patent: Dec. 18, 2018

(54) PROGRAMMING METHOD OF A NONVOLATILE MEMORY DEVICE AND A METHOD THEREOF

(71) Applicant: Samsung Electronics Co., Ltd., Suwon-si, Gyeonggi-do (KR)

(72) Inventors: Doo-hyun Kim, Ansan-si (KR); Il-han Park, Suwon-si (KR); Jong-hoon Lee, Hwaseong-si (KR)

(73) Assignee: Samsung Electronics. Co., Ltd., Gyeonggi-do (KR)

(*) Notice: Subject to any disclaimer, the term of this patent is extended or adjusted under 35 U.S.C. 154(b) by 0 days.

(21) Appl. No.: 15/714,155

(22) Filed: Sep. 25, 2017

(65) Prior Publication Data

US 2018/0218775 A1    Aug. 2, 2018

(30) Foreign Application Priority Data

Feb. 2, 2017 (KR) .................. 10-2017-0015134

(51) Int. Cl.
| | | |
|---|---|---|
| *G11C 16/04* | (2006.01) | |
| *G11C 16/14* | (2006.01) | |
| *G11C 11/56* | (2006.01) | |
| *G11C 16/16* | (2006.01) | |
| *G11C 16/34* | (2006.01) | |

(52) U.S. Cl.
CPC .......... *G11C 16/14* (2013.01); *G11C 11/5635* (2013.01); *G11C 16/0483* (2013.01); *G11C 16/16* (2013.01); *G11C 16/3445* (2013.01)

(58) Field of Classification Search
CPC .. G11C 16/14; G11C 11/5635; G11C 16/0483
USPC .......................... 365/185.29, 185.18, 185.22
See application file for complete search history.

(56) References Cited

U.S. PATENT DOCUMENTS

| | | | |
|---|---|---|---|
| 7,965,554 B2 | 6/2011 | Lutze et al. | |
| 8,077,524 B2 | 12/2011 | Lutze et al. | |
| 8,391,075 B2 | 3/2013 | Fujiki et al. | |
| 8,437,199 B2 | 5/2013 | Park | |
| 8,565,018 B2 | 10/2013 | Goda et al. | |
| 8,593,877 B2 | 11/2013 | Joo | |
| 8,605,507 B2 | 12/2013 | Liu et al. | |
| 8,780,630 B2 | 7/2014 | Park | |
| 8,913,431 B1* | 12/2014 | Costa ................. | G11C 16/0408 365/185.05 |

(Continued)

*Primary Examiner* — Vu Le
(74) *Attorney, Agent, or Firm* — Harness, Dickey & Pierce, P.L.C.

(57) ABSTRACT

A soft erase method of a memory device including applying a program voltage to a first memory cell in at least one of program loops when a plurality of program loops are performed to program the first memory cell into a $N^{th}$ programming state, wherein the first memory cell is included in a selected memory cell string connected to a selected first bit line and is connected to a selected word line; and soft erasing a second memory cell by applying, in a first verification interval, a read voltage for verifying a programming state of the first memory cell to the selected word line and applying a first prepulse to a gate of a string select transistor of each of a plurality of unselected memory cell strings connected to the first bin line and a plurality of unselected memory cell strings connected to an unselected second bit line.

20 Claims, 29 Drawing Sheets

(56) References Cited

U.S. PATENT DOCUMENTS

| | | |
|---|---|---|
| 8,917,555 B2 | 12/2014 | Baek |
| 9,087,601 B2 | 7/2015 | Dutta et al. |
| 9,165,671 B2 | 10/2015 | Lee |
| 9,190,151 B2 | 11/2015 | Nam et al. |
| 9,218,874 B1 | 12/2015 | Koh et al. |
| 9,318,202 B2 | 4/2016 | Nam |
| 9,396,800 B2 | 7/2016 | Shim et al. |
| 9,424,947 B2 | 8/2016 | Kwak et al. |
| 2007/0183208 A1 | 8/2007 | Tanaka et al. |
| 2008/0130363 A1* | 6/2008 | Hosono .............. G11C 16/3418 365/185.2 |
| 2014/0241069 A1 | 8/2014 | Kwak et al. |
| 2015/0318045 A1* | 11/2015 | Yun ................... G11C 16/3431 365/185.05 |

* cited by examiner

FIG. 20C

Table

| PGM Vol_Lev (PVL) | Pre-Pulse Sup_Time (PPST) |
|---|---|
| Lev_1 | T_1 |
| Lev_2 | T_2 |
| Lev_3 | T_3 |
| ... | ... |
| Lev_H | T_H |

US 10,157,674 B2

PROGRAMMING METHOD OF A NONVOLATILE MEMORY DEVICE AND A METHOD THEREOF

CROSS-REFERENCE TO RELATED APPLICATION

This application claims the benefit of Korean Patent Application No. 10-2017-0015134, filed on Feb. 2, 2017, in the Korean Intellectual Property Office, the disclosure of which is incorporated herein in its entirety by reference.

BACKGROUND

The inventive concept relates to a nonvolatile memory device, and more particularly, to a soft erase method and a programming method of a nonvolatile memory device including a three-dimensional memory array.

A memory device is used to store data and is classified into a volatile memory device and a nonvolatile memory device. The nonvolatile memory device may be used in a mobile phone, a digital camera, a portable digital assistant (PDA), a transportable computer device, a fixed-type computer device, and other devices.

SUMMARY

The inventive concept provides a soft erase method and a programming method of a nonvolatile memory device for improving data program and data read operation performance with respect to the nonvolatile memory device. According to an aspect of the inventive concept, a soft erase method of a nonvolatile memory device including a three-dimensional memory cell array is disclosed. The three-dimensional memory cell array includes a plurality of memory cell strings, and each memory cell string includes a string select transistor, a plurality of memory cell transistors and a ground select transistor vertically stacked on a silicon substrate. Each memory cell string is coupled to a bit line and a common source line respectively. The method comprises, performing a plurality of program loops to program a first memory cell into a first programming state, the first programming state being one of N programming states of the first memory cell, and the first memory cell is associated with a selected memory cell string coupled to a selected bit line and a selected word line respectively; performing a soft erase operation on a second memory cell during a first verification interval, the second memory cell is associated with an unselected memory cell string which is coupled to the selected bit line and the selected word line respectively, the soft erase operation being performed by applying a first pre-pulse to a gate of a string select transistor of the unselected memory cell string; and performing a verifying operation on a first memory cell during a second verification interval, the verifying operation being performed by applying a turn on voltage to a gate of string select transistor of the selected memory cell string, wherein, the second verification interval is later in time than the first verification interval.

According to another aspect of the inventive concept, a soft erase method of a nonvolatile memory device including a three-dimensional memory cell array is disclosed. The three-dimensional memory cell array including a plurality of memory cell strings, each memory cell string including a string select transistor, a plurality of memory cell transistors and a ground select transistor vertically stacked on a silicon substrate, and each memory cell string is couple to a bit line and a common source line respectively. The method comprises performing a plurality of program loops to program a first memory cell into a first programming state, the first programming state being one of N programming states of the first memory cell, and the first memory cell is associated with a selected memory cell string coupled to a selected bit line and a selected word line respectively; performing a soft erase operation on a second memory cell during a first verification interval, the second memory cell is associated with an unselected memory cell string which is coupled to the selected bit line and the selected word line respectively, the soft erase operation being performed by applying a first pre-pulse to a gate of a string select transistor of the unselected memory cell string and a second pre-pulse to a gate of a string select transistor of the selected memory cell string; and performing a verifying operation on a first memory cell during a second verification interval, the verifying operation being performed by applying a turn on voltage to a gate of string select transistor of the selected memory cell string, wherein, the second verification interval is later in time than the first verification interval, and the voltage level of the first pre-pulse is higher than that of the second pre-pulse.

According to another aspect of this inventive concept, a soft erase method of a nonvolatile memory device including a three-dimensional memory cell array is disclosed. The three-dimensional memory cell array including a plurality of memory cell strings, each memory cell string including a string select transistor, a plurality of memory cell transistors and a ground select transistor vertically stacked on a silicon substrate, and each memory cell string are couple to a bit line and a common source line respectively. The method comprises performing a program operation to program a first memory cell of a selected memory cell string which is coupled to a bit line through a first string select transistor; and performing a verifying operation on the first memory cell. The verifying operation includes applying a first pre-pulse on a gate of a second string select transistor of a unselected memory cell string, the unselected memory cell string is coupled to the bit line through the second string select transistor during a first verification interval; and applying a turn on voltage to a gate of the first string select transistor of the selected memory cell string during a second verification interval, wherein, the second verification interval is later in time than the first verification interval.

BRIEF DESCRIPTION OF THE DRAWINGS

Embodiments of the inventive concept will be more clearly understood from the following detailed description taken in conjunction with the accompanying drawings in which:

FIGS. 20A, 20B, and 20C are diagrams for illustrating a method that determines and controls an application time of pre-pulse based on a program voltage level, according to an embodiment.

DETAILED DESCRIPTION OF THE EMBODIMENTS

Hereinafter, an embodiment of the present invention will be described in detail by referring to the attached drawings.

Figure 1:
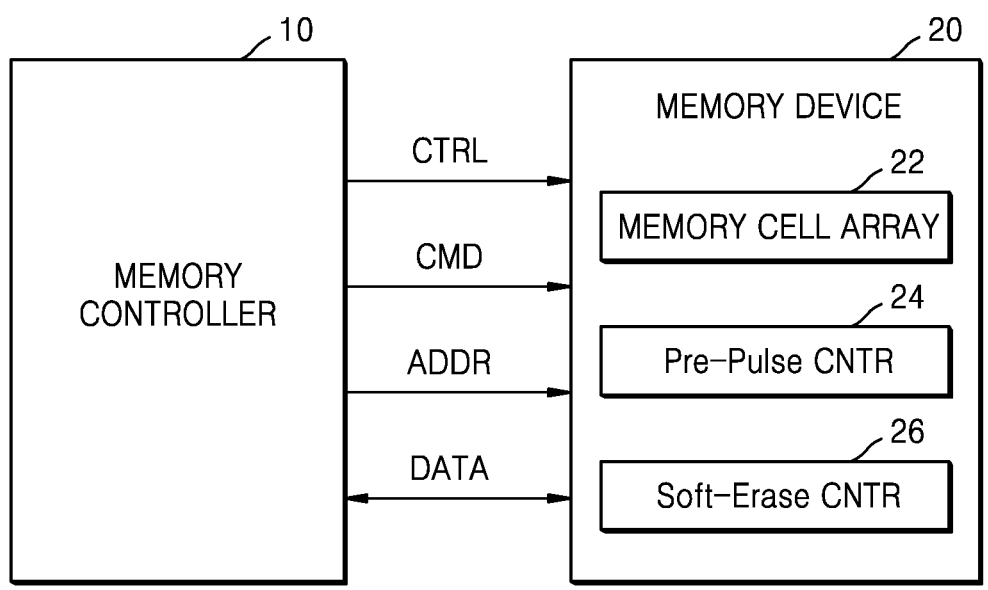
FIG. 1 is a block diagram that schematically illustrates a memory system according to an embodiment.

FIG. 1 is a block diagram that schematically illustrates a memory system 1 according to an embodiment.

Referring to FIG. 1, the memory system 1 may include a memory controller 10 and a memory device 20. The memory device 20 may include a memory cell array 22, a pre-pulse controller 24, and a soft-erase controller 26. However, a structure of the memory device 20 shown in FIG. 1 is simply provided as an example, and the structure is not limited thereto, but a structure of the pre-pulse controller 24 and the soft-erase controller 26 may be included in the memory controller 10, or the memory controller 10 may perform the same functions of the pre-pulse controller 24 and the soft-erase controller 26. Also, the pre-pulse controller 24 and the soft-erase controller 26 may be realized in various logic modes. Hereinafter, as an exemplary embodiment, elements of the memory controller 10 and the memory device 20 shown in FIG. 1 will be described in detail.

The memory controller 10 may perform a control operation with respect to the memory device 20. In particular, the memory controller 10 may control program (or writing), read (or comprehend), and erase (or remove) operations with respect to the memory device 20 by providing an address ADDR, a command CMD, and a control signal CTRL to the memory device 20.

The memory cell array 22 may include a plurality of memory cells (not shown) that are arranged at intersections of a plurality of word lines (not shown) and a plurality of bit lines (not shown). Further, the memory cell array 22 may include word lines, at least one string select line and at least one ground select line, and a plurality of memory blocks. The plurality of memory blocks are arranged in a first direction and a second direction on a substrate respectively and may include a plurality of strings having a three-dimensional structure that are arranged in a third direction (a direction perpendicular to a plane formed by the first direction and the second direction). Each of the plurality of strings may include at least one string select transistor, a plurality of memory cells, and at least one ground select transistor that are arranged in a direction perpendicular to the substrate. The description in this regard will be provided in detail.

In one embodiment, the plurality of memory cells may be flash memory cells, and the memory cell array 22 may be a NAND flash memory cell array or a NOR flash memory cell array. Hereinafter, embodiments will be described by referring to a case when the plurality of memory cells are flash memory cells. However, the memory cells are not limited thereto, and, in some embodiments, the plurality of memory cells may be resistive memory cells such as resistive RAM (RRAM), phase change RAM (PRAM), or magnetic RAM (MRAM).

The pre-pulse controller 24 according to an embodiment may control an operation of applying a predetermined pre-pulse through a string select line connected to a string select transistor of each of unselected memory cell strings. The pre-pulse controller may generate a pre-pulse that is transmitted to a string channel to remove a charge accumulated in the string channel during boosting operation of the string channel of the unselected memory cell strings. The boosting operation may occur during a read or verify operation. In particular, when a plurality of program loops for programming data to the memory cells of the memory cell array 22 are performed, the pre-pulse controller 24 may control a pre-pulse operation based on a program voltage of each of the program loops. For example, when a program voltage level applied selected memory cells on the selected word line exceeds a reference voltage level, the pre-pulse controller 24 may determine whether to perform a pre-pulse operation in the $N^{th}$ program loop and may control the pre-pulse operation. The program loop may include a program interval, at which a program voltage is applied to the selected memory cells, and a verification interval, at which a verification voltage is applied to the selected memory cells to confirm a programming state of the selected memory cells, and a pre-pulse interval, at which a pre-pulse operation is performed, may be further included in the program loop in addition to the program interval and the verification interval, or the pre-pulse controller 24 may control a pre-pulse operation so that the pre-pulse interval is included in the verification interval.

Furthermore, the pre-pulse controller 24 may determine a pre-pulse sending time based on a program voltage level that is being applied to the selected memory cells for Nth program loop, and may apply a pre-pulse to a gate of a string select transistor of the unselected memory cell based on the pre-pulse sending time. The pre-pulse controller 24 may determine a loop which requires pre-pulse among the program loops. When the program loop is set as a loop which requires the pre-pulse, the pre-pulse operation may be controlled regardless of a program voltage level. Also, the pre-pulse controller 24 may set a pre-pulse inhibition loop that does not perform a pre-pulse operation among the program loops, and when the program loop is set as the pre-pulse inhibition is applied, the pre-pulse operation may be inhibited regardless of a program voltage level.

When the pre-pulse operation of the pre-pulse controller 24 according to an embodiment is performed, hot carrier injection caused by boosting charges of the unselected memory cell string may be prevented, resulting in the reduction of read disturbance during read or verify operation.

When a plurality of program loops are performed on a memory cell that is included in a selected memory cell string connected to a selected bit line and is connected to a selected word line, the soft-erase controller 26 may control a soft erase operation on the memory cell. In one embodiment, the soft-erase controller 26 may control a voltage level to be applied to the memory cell array 22 during the program loop. In particular, when the plurality of program loops are performed to program a first memory cell that is included in a selected memory cell string which is connected to a selected first bit line and to a selected word line respectively, the soft-erase controller 26 may control a read voltage for verifying a programming state of the first memory cell to be applied to the selected word line in a first verification interval A. The soft-erase controller 26 may further control a pre-pulse to be applied to a gate of a string select transistor of each of a plurality of unselected memory cell strings connected to a first bit line and a plurality of unselected memory cell strings connected to the selected bit line, after a program interval to perform soft-erase on a second memory cell that is included in the selected memory cell string connected to the second bit line and is connected to the selected word line. The description in this regard will be provided in detail in relation to FIGS. 5 to 13.

A shape of threshold voltage distribution of the memory cells during a program operation may be improved according to the soft erase operation of the soft-erase controller 26, and thus reliability of the memory system 1 may improve.

Figure 2:
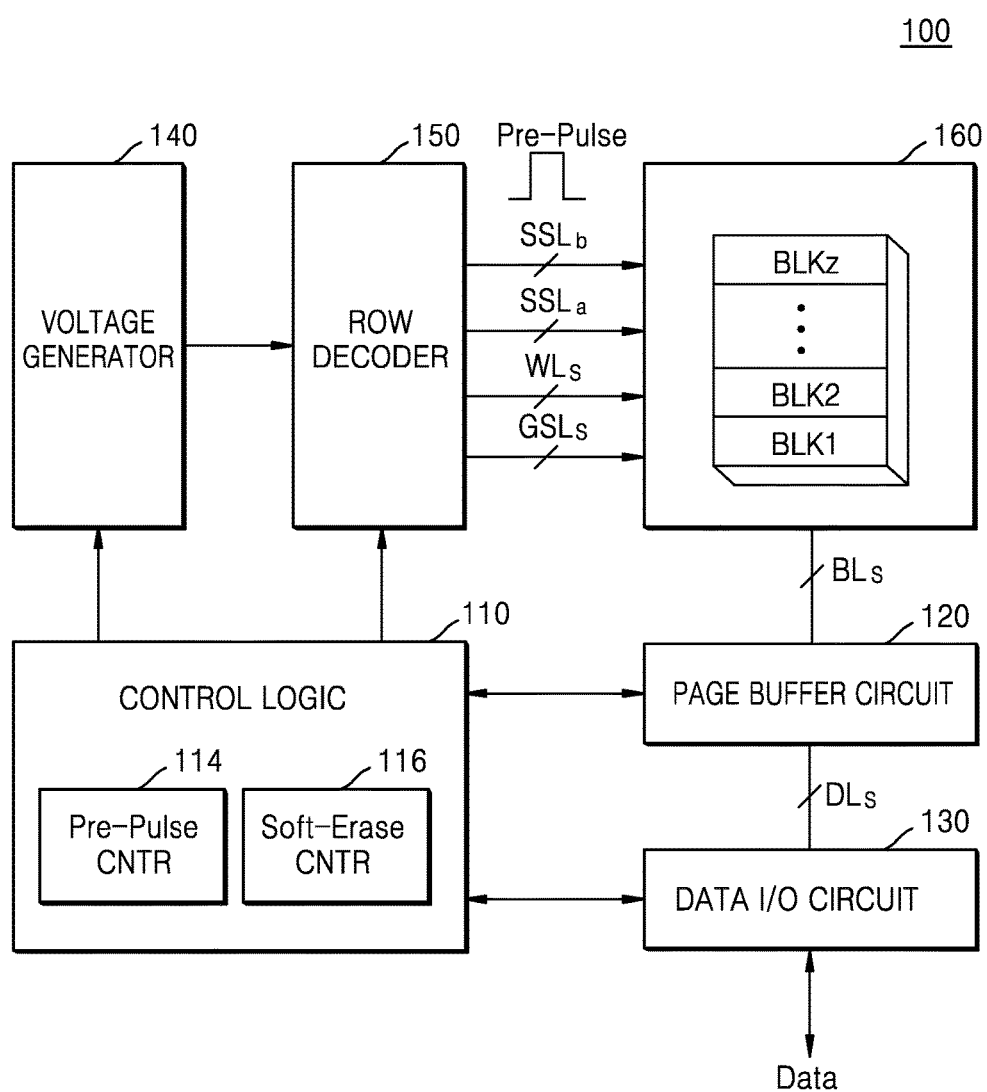
FIG. 2 is a block diagram that illustrates a memory device in detail according to an embodiment.

FIG. 2 is a block diagram that illustrates a memory device 100 in detail according to an embodiment.

Referring to FIG. 2, the memory device 100 may include a control logic 110, a page buffer circuit 120, a data I/O circuit 130, a voltage generator 140, a row decoder 150, and a memory cell array 160.

The memory cell array 160 may be coupled to the row decoder 150 via word lines WLs, string select lines $SSL_a$ and $SSL_b$, and ground select lines GSLs and the memory cell array also may be connected to the data I/O circuit 130 via bit lines BLs. The memory cell array 160 may include a plurality of memory blocks BLK1 to BLKz.

The memory cell array 160 may include a plurality of NAND cell strings. Each of the strings may form a channel in a vertical direction or a horizontal direction. In the memory cell array 160, a plurality of word lines WLs may be stacked in a vertical direction. Each of the word lines WLs may form control gates of the memory cells included in the string. For a three-dimensional NAND cell strings, the channel of the memory cell may be formed in a vertical direction.

According to the arrangement of the memory cell array 160, each of the strings that share one bit line BL may be individually selected. Each of the strings being individually selected may be connected to a plurality of ground select lines GSLs that are electrically separated from each other. Therefore, channels of the strings that share one bit line BL through control of the ground select lines GSLs may be selectively pre-charged. For example, a plurality of strings may be connected to a bit line (hereinafter, also referred to as "selected bit line") to which 0 V is applied for the programming. However, an inhibition memory cell string among the memory cell strings may also be connected to the selected bit line BL. The inhibition string is a string in which programming operation is inhibited. Hereinafter, the inhibition string is also referred to as "unselected memory cell string." A potential of the channel of the unselected memory cell string needs to be sufficiently boosted when a program voltage is applied to a word line WL for preventing an inhibition cell connected to the word line from being programmed.

The row decoder 150 may select one of the word lines WLs of the memory cell array 160 by decoding an address. The row decoder 150 may provide a word line voltage that is provided from the voltage generator 140 to a selected word line WL of the memory cell array 160. For example, during a program operation, the row decoder 150 may provide a program voltage to the selected word line WL and a pass voltage to unselected word lines WLs. Also, the row decoder 150 may provide a select voltage to selected memory cell string lines $SSL_a$.

The page buffer circuit 120 may operate as a writing driver or a sense amplifier according to an operation performed by the control logic 110. During performance of the program operation, the page buffer circuit 120 may provide a voltage that corresponds to data to be programmed by the bit lines BLs of the memory cell array 160 in which the strings $SSL_a$ and $SSL_b$ are formed in a vertical structure. During performance of a read operation, the page buffer circuit 120 may detect data stored in the selected memory cell through the bit lines BLs and provide the data to the data I/O circuit 130.

The data I/O circuit 130 may be connected to the page buffer circuit 120 via data lines DLs and may provide input data Data to the page buffer circuit 120 or may output data Data provided from the page buffer circuit 120 to the outside, The data I/O circuit 130 may provide an input address or command to the control logic 110 or the row decoder 150.

The control logic 110 may include a pre-pulse controller 114 and a soft-erase controller 116. The control logic 110 may control a program operation, a read operation, and an erase operation in response to the command transmitted from the data I/O circuit 130. The pre-pulse controller 114 may control an operation of applying a pre-pulse Pre-Pulse to a string select line $SSL_b$ coupled to an unselected memory cell string to remove a charge of a boosting channel of the unselected memory cell string during a read or verify operation. The string select line coupled to a gate of string select transistor of unselected memory cell string may be referred to as "unselected memory cell string select line" for the purpose of explaining this inventive concept. In particular, when the control logic 110 controls a program loop, the pre-pulse controller 114 may control a pre-pulse operation to be performed in the program loop, and the pre-pulse controller 114 may control the pre-pulse operation based on a program voltage level that is applied to the memory cells in the program interval of the program loop.

The soft-erase controller 116 may control a soft erase operation performed on the memory cells that are included in an unselected memory cell string. The unselected memory cell string may refer to an s memory cell string connected to a selected bit line and are connected to the selected word line while performing the program loop. In particular, in the first verification interval, the soft-erase controller 116 may control a pre-pulse Pre-Pulse applied to an unselected memory cell string $SSL_b$ which is not a subject of the program, and. During the second verification interval, the soft-erase controller 116 may apply a predetermined select voltage to a selected memory cell string select line $SSL_a$ selected memory cell string. The selected memory cell string select line may be connected to at least one selected memory cell string which is a subject of the program. That is, the soft-erase controller 116 may control timing of applying a pre-pulse Pre-Pulse to the string select line $SSL_b$ connected to the unselected memory cell string and timing of applying a select voltage to the string select line $SSL_a$ connected to the selected memory cell string different from each other and thus may perform a soft erase operation with respect to a memory cell that is included in the selected memory cell string connected to an unselected bit line in the first verification interval A and is connected to the selected word line. In this regard, the soft-erase controller 116 may control the pre-pulse controller 114 or the voltage generator 140 to control timing of applying a pre-pulse Pre-Pulse and may control the voltage generator 140 and the row decoder 150 to provide a voltage required to perform the program loop to the memory cell array 160 at predetermined timing.

Although the soft-erase controller 116 is described in terms of controlling a soft erase operation, functions of the soft-erase controller 116 is not limited thereto, and the soft-erase controller 116 may perform various operations including controlling a program loop.

Figure 3:
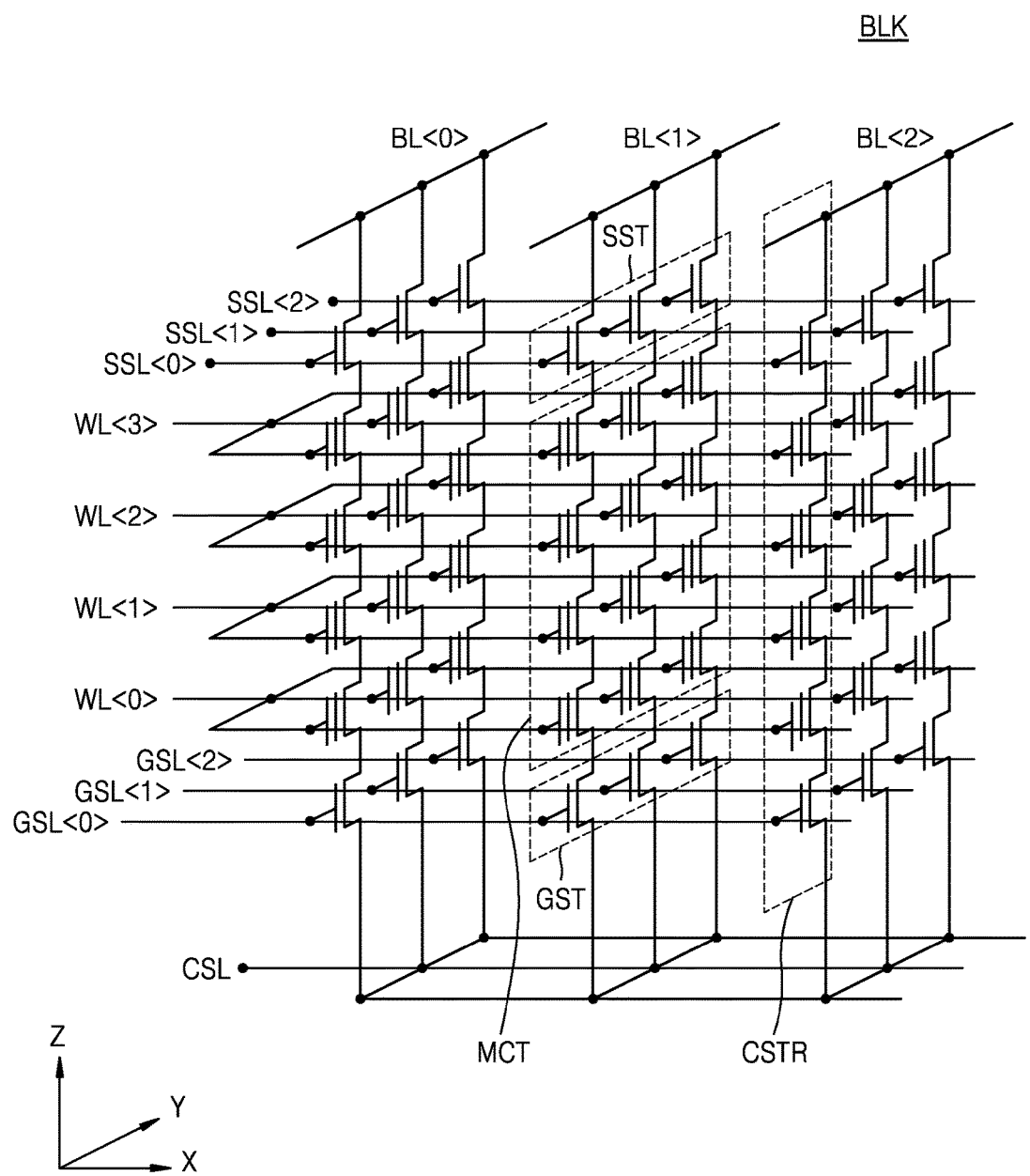
FIG. 3 is a circuit diagram that illustrates a memory block shown in FIG. 2 according to an embodiment.

FIG. 3 is a circuit diagram that illustrates a memory block BLK1 shown in FIG. 2 according to an embodiment.

Referring to FIG. 3, a memory block BLK includes a plurality of bit lines BL<0> to BL<2> that are formed in a Y direction at top portion of the three-dimensional memory block. A common source line CSL may be formed in a XY plane at a bottom part of the memory block BLK. A plurality of strings CSTRs may be formed in a Z direction between the plurality of bit lines BL<0> to BL<2> and the common source line CSL. Each of the strings CSTRs connected to the bit line BL<1> may include a string select transistor SST. Due to the string select transistor SST, the strings CSTR may be electrically connected with the bit line BL<1>. Each of the stings CSTRs connected to the bit line BL<1> may include a ground select transistor GST. Due to the ground select transistor GST, the strings CSTRs may be electrically connected with the common source line CSL. Memory cell transistors MCTs connected in series may be connected in a Z direction between the string select transistor SST and the ground select transistor GST. In the memory block BLK1 according to an embodiment, a word line WL<3> may be connected to the memory cell transistors MCT formed in same word line layer. Thus, the memory cell transistors MCT in one layer may receive the same word line voltage. During the program operation, a program voltage may be applied to a selected word line among word lines WL<0> to WL<3>, and a pass voltage may be applied to other unselected word lines. Thus, all the memory cells in a layer that corresponds to the selected word line may receive a program voltage. On the other hand, the string select transistors SST formed in one layer may be connected to a plurality of string select lines SSL<0> to SSL<2>. A plurality of strings may be connected to a program bit line BL<1> to which 0 V is applied during a program operation.

Hereinafter, a bit line BL<1> to which 0 V is applied during a program operation is referred to as "selected bit line", and a bit line to which a power voltage Vcc is applied is referred to as "unselected bit line". A string (hereinafter, also referred to as "selected memory cell string") in which the selected bit line BL<1> and the channel need to be electrically connected may exist among the plurality of strings connected to the selected bit line BL<1>. An unselected memory cell string among the plurality of strings connected to the selected bit line BL<1> may be a string in which the selected bit line BL<1> and the channel are electrically cut off. A plurality of sting select lines SSL<0> to SSL<2> that are each extended in an X direction may be formed to select the unselected memory cell string and the selected memory cell string. In one embodiment, a memory cell array 22 of FIG. 1 having a vertical string structure according to an embodiment of the inventive concept may include ground select lines GSL<0> to GSL<2> for individually controlling the ground select transistors GSTs. An unselected memory cell string may exist among the plurality of strings connected to the selected bit line BL<1>. Here, X, Y, and Z directions are perpendicular from one another and are provided herein as an example to describe a three-dimensional vertical structure memory block BLK. However, structures of one or more embodiments of the inventive concept are not limited to a case when the X, Y, and Z directions are perpendicular from one another.

Figure 4:
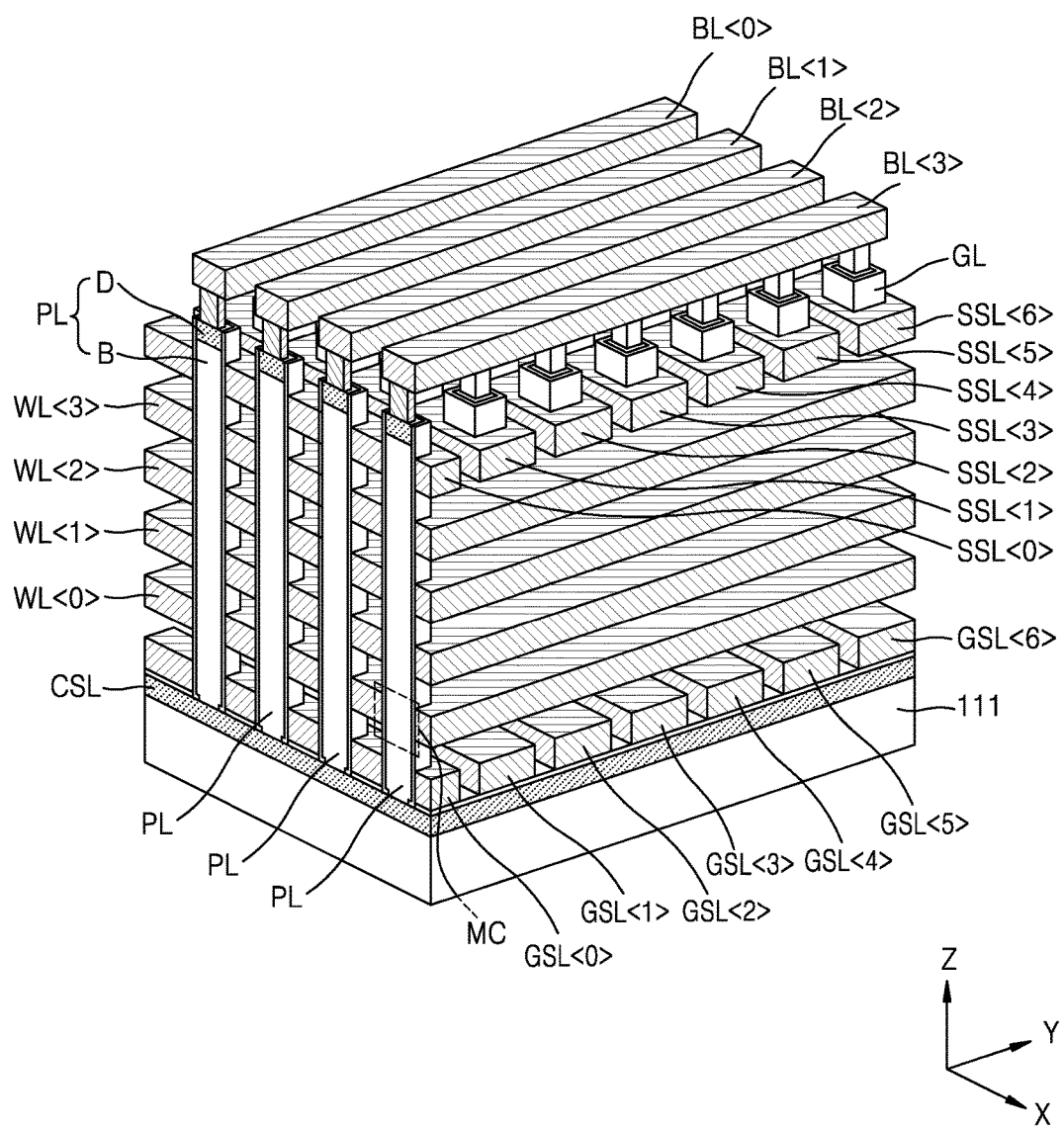
FIG. 4 is a perspective view of a memory block BLK1 shown in FIG. 2 according to an embodiment.

FIG. 4 is a perspective view of a memory block BLK1 shown in FIG. 2 according to an embodiment.

Referring to FIG. 4, the memory block BLK1 may include a common source line CSL, a plurality of bit lines BL<0> to BL<3>, and a plurality of strings that are arranged between the common source line CSL and the bit lines BL<0> to BL<3>. The common source line CSL may be a conductive thin film disposed on a substrate 111 or an impurity region that is formed in the substrate 111. The bit lines BL<0> to BL<3> may be conductive patterns (e.g., metal lines) that are disposed on the top of the substrate 111 and may be separated from the substrate 111. A plurality of strings are connected in parallel to each of the bit lines BL<0> to BL<3> that are 2-dimensionally arranged. Accordingly, the strings are 2-dimensionally arranged on the common source line CSL or the substrate 111. Each of the strings may include a ground select transistor GST that is connected to the common source line CSL, a string select transistor SST that is connected to the bit lines BL<0> to BL<3>, and a plurality of memory cell transistors MCT that are disposed between the ground and string select transistors GST and SST. The ground select transistor, the string select transistor SST, and the memory cell transistors MCTs may be connected in series. Moreover, a plurality of ground select lines GSL<0> to GSL<6>, a plurality of word lines WL<0> to WL<3>, and a plurality of string select lines SSL<0> to SSL<6> that are disposed between the common source line CSL and the bit lines BL<0> to BL<3> may be used as gate electrodes of the ground select transistor GST, the memory cell transistors MCTs, and the string select transistors SSTs, respectively. All of the ground select transistors GSTs may be substantially disposed at the same distance from the substrate 111. Also, their gate electrodes may be separated from a plurality of conductors in a Y direction. That is, the plurality of ground select lines GSL<0> to GSL<6> may be each formed to intersect the bit lines BL<0> to BL<3>. Thus, different voltages may be provided to the plurality of ground select lines GSL<0> to GSL<6>.

Generally, same level of voltage is applied to the gate electrodes of the plurality of memory cell transistors disposed from substantially the same distance from the common source line CSL because they are commonly connected to one of the word lines WL<0> to WL<3>. In this regard, each of the word lines WL<0> to WL<3> may be a conductive pattern having a flat shape or a comb shape that is parallel to a top surface of the substrate 111. Each string may include a plurality of memory cell transistors that are disposed at different distances from the common source line CSL. Thus, multi layers of the word lines WL<0> to WL<3> are disposed between the common source line CSL and the bit lines BL<0> to BL<3>. Each of the strings may further include a semiconductor pillar PL that is perpendicularly extended from the common source line CSL and is connected to the bit lines BL<0> to BL<3>. The semiconductor pillar PL may be formed to penetrate the ground select lines GSL<0> to GSL<6> and the word lines WL<0> to WL<3>. Moreover, the semiconductor pillar PL may include a body part B and impurity regions that are formed at one end or both ends of the body part B. An information storage layer may be disposed in string channel formed between the word lines and the semiconductor pillar PL. In one embodiment, the information storage layer may be a charge storage layer. For example, the information storage layer may be one selected from a trap insulating layer and an insulating layer including a floating gate or conductive nano-dots. A dielectric layer that is used as a gate insulating layer of the ground select transistor or the string select transistor may be disposed between each of the ground select lines GSL<0> to GSL<6> and the semiconductor pillars PLs or between each of the string select lines SSL<0> to SSL<6> and the semiconductor pillars PLs.

Figure 5:
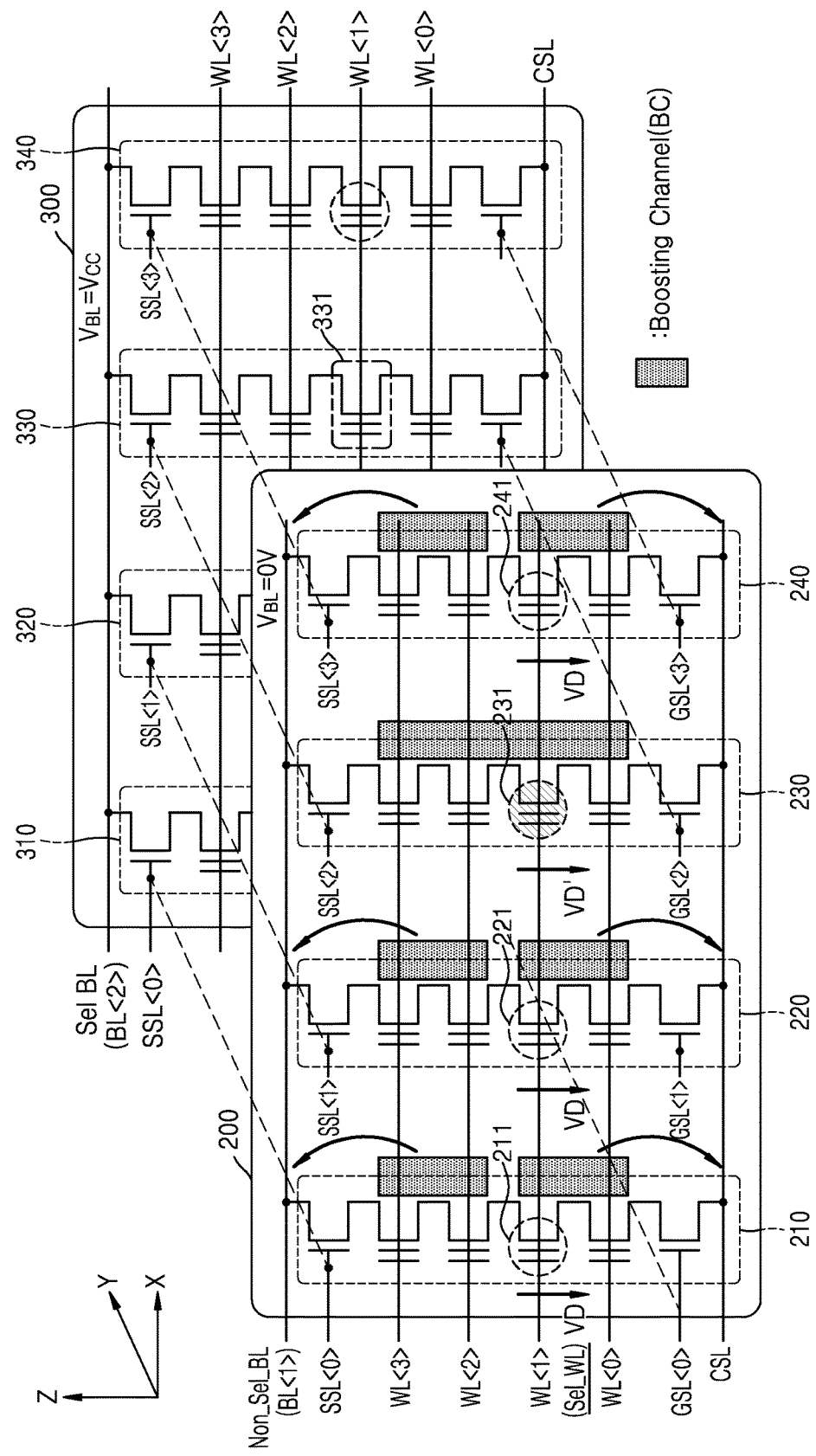
FIG. 5 is a schematic view that illustrates a soft erase operation according to an embodiment.
Figure 6:
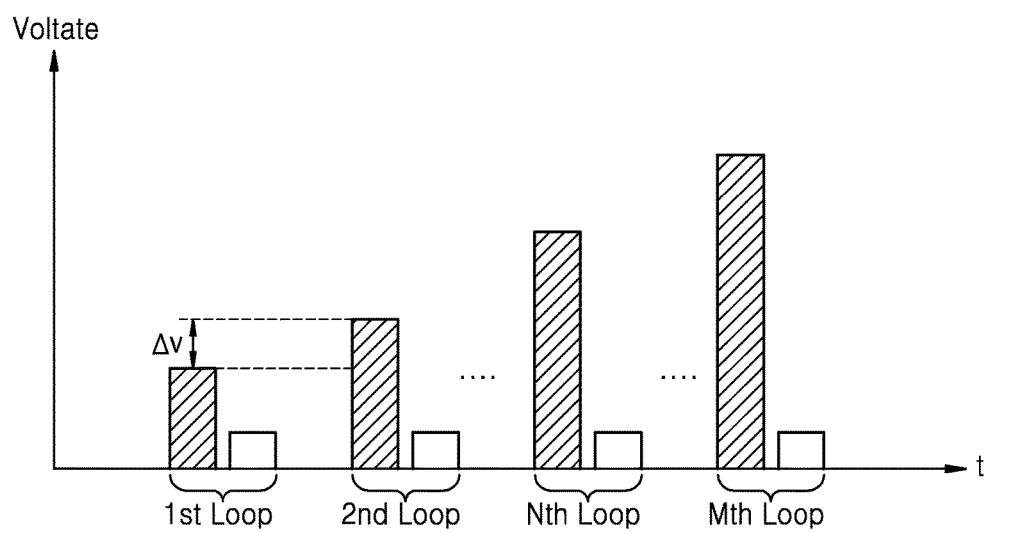
FIG. 6 is a diagram that illustrates a relationship between a program loop and a soft erase operation, according to an embodiment.
Figure 7:
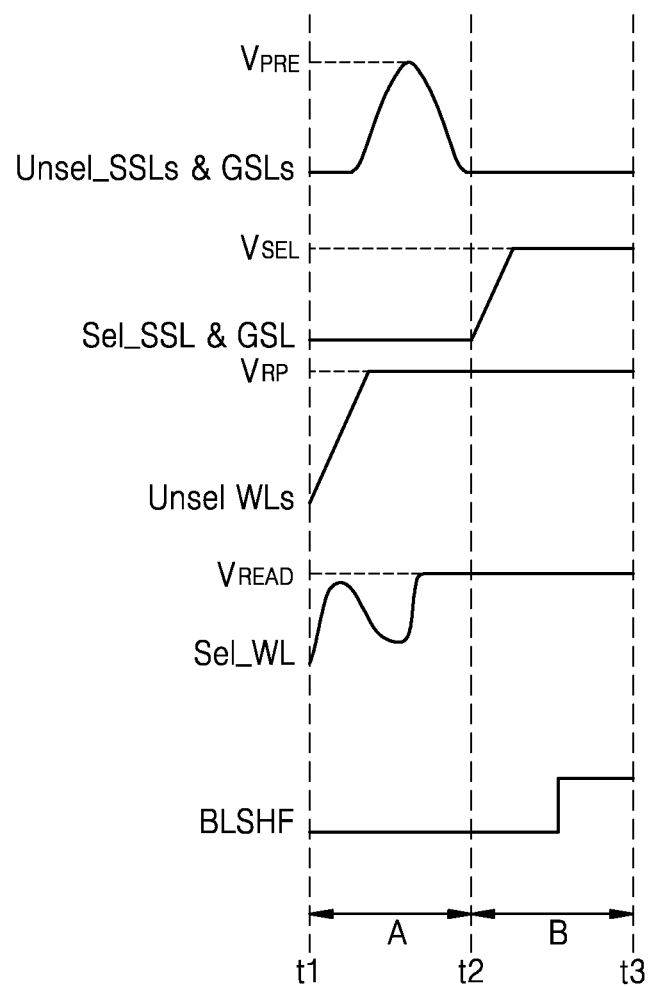
FIGS. 7 and 8 are diagrams that illustrate a soft erase operation according to an embodiment.
Figure 8:
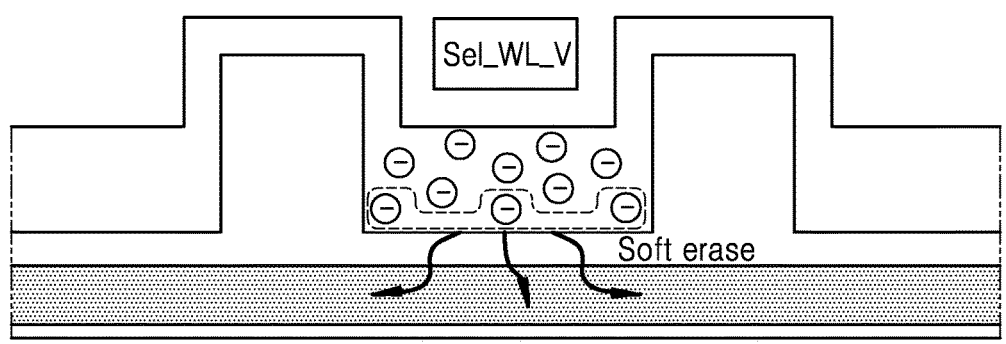

FIGS. 5, 7, and 8 are diagrams that illustrate a soft erase operation according to an embodiment, and FIG. 6 is a graph that illustrates a relationship between a program loop and a soft erase operation, according to an embodiment.

First, referring to FIGS. 2 and 6, the control logic 110 may perform a plurality of program loops 1st Loop-Mth Loop to program the selected memory cells of the memory cell array 160 to a predetermined programming state. In particular, the control logic 110 may perform a program operation (PO) that provides a program voltage having a predetermined level to the selected memory cells; and a verify operation (VO) that verifies a programming state by providing a verify voltage after performing each program loop. The verify operation may verify a programming state by providing a verify voltage. The soft-erase controller 116 may perform a soft erase operation in at least one program loop selected from the plurality of program loops 1st Loop-Mth Loop.

As shown in FIG. 5, the bit lines BL<2> and the word lines WL<2> are each assumed as selected to perform the plurality of program loops 1st Loop to Mth Loop shown in FIG. 6. Therefore, BL<1> and WL<0>, WL<2>, and WL<3> may be unselected. Strings 210 to 240 that are connected to the first bit line BL<1> may share string select lines SSL<0> to SSL<3> with strings 310 to 340 connected to the second bit line BL<2>.

In FIG. 7, the verification operation includes a first verification interval A which ranges from a first time t1 to a second time t2; and a second verification interval B from the second time t2 to a third time t3. The first and second verification intervals may follow each program loop as shown in FIG. 6.

selected memory cell string Referring to FIG. 7, a first pre-pulse $V_{PRE}$ may be provided to string select lines and ground select lines SSL<0>, SSL<1>, SSL<3>, GSL<0>, GSL<1>, and GSL<3>; and Unsel_SSLs & GSLs that correspond to the unselected memory cell strings 210, 220, and 240 of the unselect bit line BL<1> in the first verification interval A. At the same time, in the first verification interval A, a read pass voltage $V_{RP}$ may be provided to the unselected word lines WL<0>, WL<2>, and WL<3>; and a read voltage $V_{READ}$ for verifying a programming state may be applied to the selected word line WL<1>. Due to the first pre-pulse $V_{PRE}$ provided to the sting select lines and ground select lines SSL<0>, SSL<1>, SSL<3>, GSL<0>, GSL<1>, and GSL<3>; and Unsel_SSLs & GSLs that correspond to the unselected memory cell strings 210, 220, and 240 of the unselect bit line BL<1> in the first verification interval A, the unselected memory cell strings 210, 220, and 240 are electrically connected with the unselect bit line BL<1> and a common source line CSL, and thus a charge of the boosting channel (BC) may be removed in a bit line direction or may be removed in a common source line direction.

As a result, a potential of channels of the unselected memory cell strings 210, 220, and 240 may be lowered, and thus gate voltages of memory cells 211, 221, and 241 that are included in the unselected memory cell strings 210, 220, and 240 and are connected to the selected word lines WL<1> may be voltage dropped (VD). Also, the memory cell 231 that is included in the selected memory cell string 230 and connected to the selected word lines WL<1> may be coupled by the gate voltage drop VD of the neighboring memory cells 211, 221, and 241 connected to the same word line WL<1>, and thus a gate voltage drop (VD') of the memory cell 231 may be generated. Consequently, as in the first verification interval A, a level of a gate voltage of the memory cell 231 that corresponds to the read voltage $V_{READ}$ that is applied through the selected word lines WL<1> may be temporarily dropped.

Referring to FIG. 8, the memory cell 231 that is included in the selected memory cell string 230 and connected to the selected word lines WL<1>. During programming operation, some charges may be left in the string channel due to the boosting of the channel. During the first verification interval A, a gate voltage Sel_WL_V of the memory cell 231 that is connected to the selected word line WL<1> may be temporarily dropped due to the charge coupling between the string channel and the selected word line. Because a potential of the boosting channel (BC) of the selected memory cell string 230 is maintained, the unstably trapped charges (e.g., shallow trapped charges) may be removed from the channel of the selected memory cell string 230. Such channel charge removal proves may be called as a "soft erase operation", because such process may bring a slight erase effect on the channel. The soft erase operation may be performed in bias condition which is used during normal erase operation in that a voltage difference between the gate voltage Sel_WL_V of the memory cell 231 and a voltage of the boosting channel (BC) forms negative bias condition.

When a soft erase operation with respect to the memory cell 231 was performed within a program loop, a separate operation may not need to remove the channel charge after the programming operation Owing to the soft erase operation, data programmed in the memory cell 231 may be more accurately read by removing the unstably trapped charges which is one of main factors causing read disturbance of the memory cell 231.

Back to FIG. 7, a select voltage $V_{SEL}$ may be provided to string select lines and ground select lines SSL<2> and GSL<2>; and Sel SSL & GSL that correspond to the selected memory cell string 230 of the unselect bit line BL<1> and a selected memory cell string 330 of the select bit line BL<2> in the second verification interval B. Also, in the second verification interval B, a BLSHF signal for activating a bit line select transistor may be changed from a low level to a high level, where the bit line select transistor is connected to the select bit line BL<2> between a page buffer circuit 120 and a memory cell array 160 to perform an operation for verifying the data read by using the read voltage $V_{READ}$. That is, a verify operation with respect to the select memory cell 331 may be performed over the first verification interval A and the second verification interval B, and, in particular, a soft erase operation with respect to another memory cell 231 may be performed in the first verification interval A. In the embodiment described above, the operation is assumed and described as being controlled by providing the same voltage to the string select lines SSLs and ground select lines GSLs that are connected to the unselected memory cell strings, but this is only an example embodiment, but embodiments are not limited thereto, and the inventive concept described above may be achieved by applying a pre-pulse only to the string select lines SSLs. Further, different voltages are individually provided to the string select lines SSLs and ground select lines GSLs.

Figure 9A:
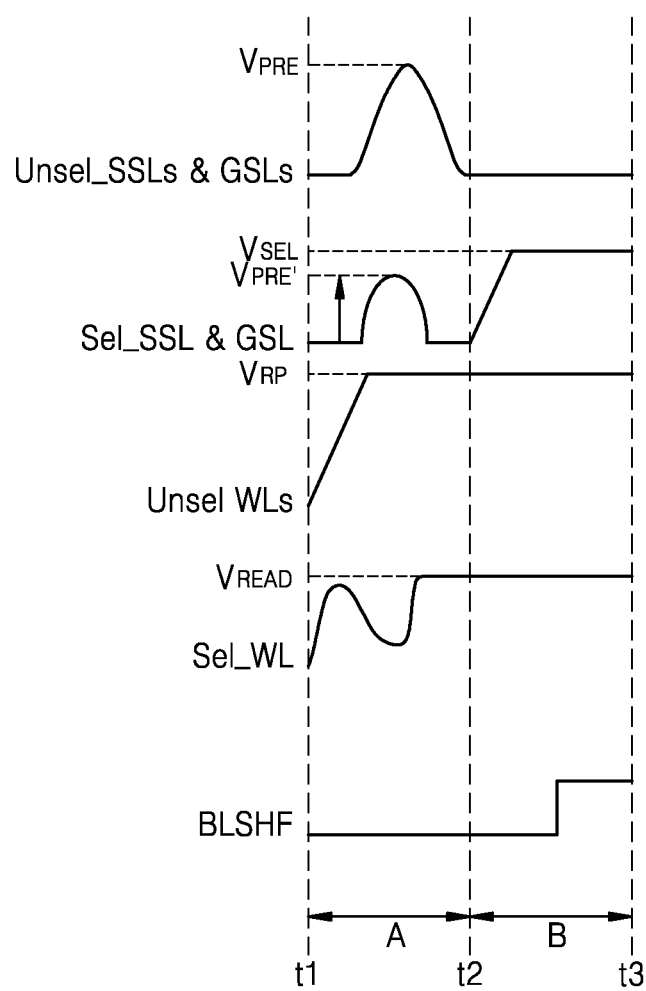
FIGS. 9A and 9B are graphs that illustrate a method of controlling a potential difference of a soft erase operation with respect to a memory cell, according to an embodiment.
Figure 9B:
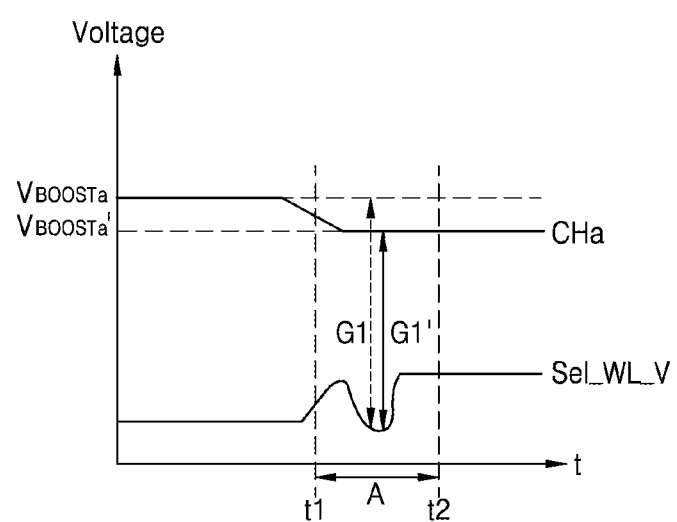

FIGS. 9A and 9B graphs that illustrate a method of controlling a potential difference of a soft erase operation with respect to a memory cell, according to an embodiment.

First, as shown in FIG. 8, when the soft erase operation is performed, when a voltage difference between a gate voltage Sel_WL_V of the memory cell 231 and the boosting channel (BC) exceeds a certain level, hot carrier injection may occur, which may become a factor of disturbance, and thus a the voltage difference may be properly regulated.

Referring to FIG. 5 and FIG. 9A, unlike FIG. 7, a second pre-pulse $V_{PRE}''$ may be provided to the string select lines and ground select lines SSL<2> and GSL<2>; and Sel SSL & GSL connected to the selected memory cell string 230 of the unselect bit line BL<1> and the selected memory cell string 330 of the select bit line BL<2> in the first verification interval A. The second pre-pulse $V_{PRE}''$ may have a maximum voltage level that is smaller than that of the first pre-pulse $V_{PRE}$ or may have a pulse width that is narrower than that of the first pre-pulse $V_{PRE}$.

Referring to FIG. 9B, a potential of a channel Cha of the selected memory cell string 230 may be dropped from a first boosting voltage $V_{BOOSTa}$ to a second boosting voltage $V_{BOOSTa}'$ by removing a certain portion of charge stored in the boosted channel Cha of the selected memory cell string 230 by providing the second pre-pulse $V_{PRE}''$. In this regard, a difference G1 between the gate voltage Sel_WL_V of the memory cell 231 that is included in the selected memory cell string 230 of the unselect bit line BL<1> and connected to the selected word lines WL<1> and the first boosting voltage $V_{BOOSTa}$ in the first verification interval A may be reduced to a difference G1' between the gate voltage Sel_WL_V of the memory cell 231 and a second boosting voltage $V_{BOOSTb}$. As a result, when a difference between a voltage of the channel Cha of the selected memory cell string 230 and the gate voltage Sel_WL_V of the memory cell 231 decreases, hot carrier injection may be reduced.

Figure 10A:
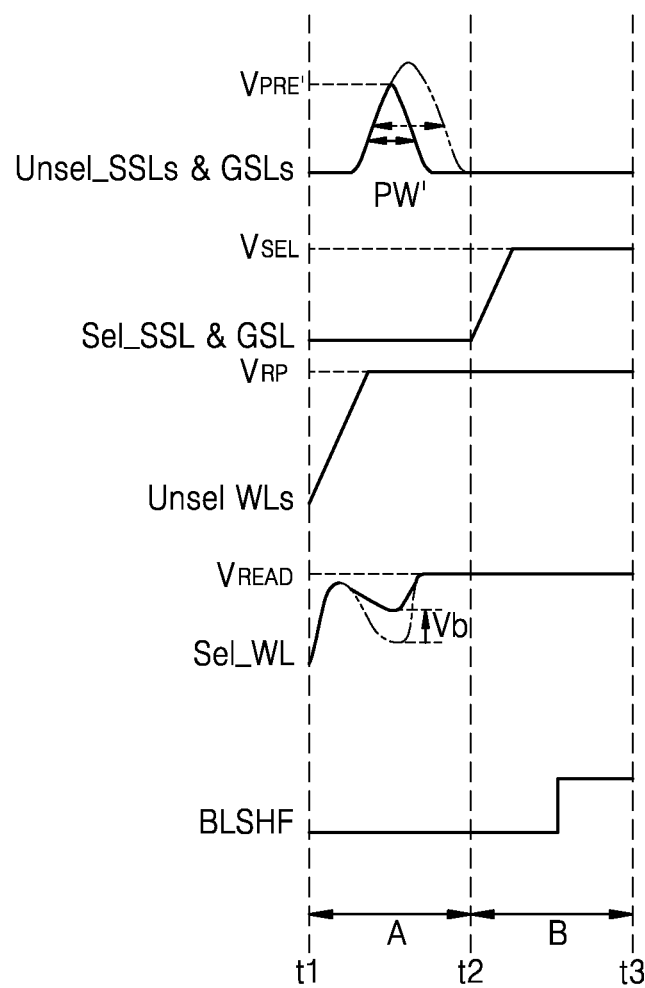
FIGS. 10A and 10B are graphs for describing a method of controlling a potential difference of a soft erase operation with respect to a memory cell, according to another embodiment.
Figure 10B:
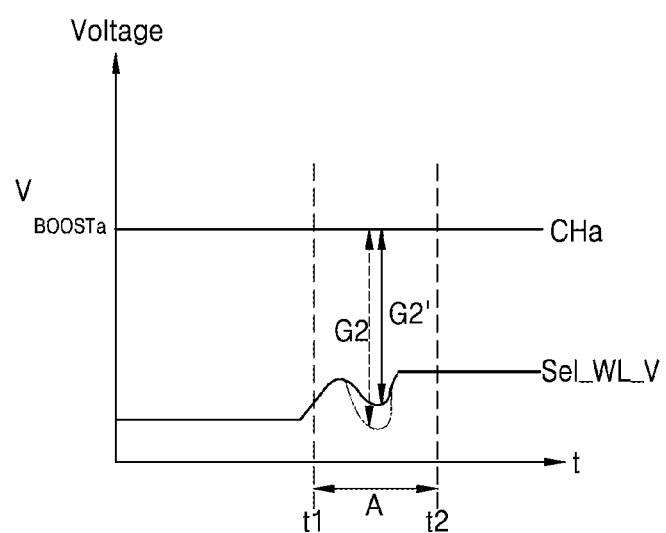

FIGS. 10A and 10B are graphs for describing a method of controlling a potential difference of a soft erase operation with respect to a memory cell, according to another embodiment.

Referring to FIG. 5 and FIG. 10A, the maximum voltage level of the first pre-pulse $V_{PRE}'$ provided to the string select lines and ground select lines SSL<0>, SSL<1>, SSL<3>, GSL<0>, GSL<1>, and GSL<3>; and Unsel SSLs & GSLs that are connected to the unselected memory cell strings 210, 220, and 240 of the unselect bit line BL<1> and the unselected memory cell strings 310, 320, and 340 of the select bit line BL<2> may be lower than the first pre-pulse $V_{PRE}$ shown in FIG. 7, or a pulse width PW' of the first pre-pulse $V_{PRE}*$ may be smaller than that of the first pre-pulse $V_{PRE}$ shown in FIG. 7.

Referring to FIG. 10B, an amount of charges that is removed in a bit line direction or removed in a common source line direction from the boosting channel (BC) of the unselected memory cell strings 210, 220, and 240 in the first verification interval A by providing the first pre-pulse $V_{PRE}'$ may be different from that in FIG. 7. As a result, voltage drop of the gate voltage Sel_WL_V of the memory cell 231 that is included in the selected memory cell string 230 of the unselect bit line BL<1> and connected to the selected word lines WL<1> decreases than of the voltage drop of the gate voltage shown in FIG. 7, and thus a difference G2' with a voltage VBOOSTa of the channel Cha of the selected memory cell string 230 may be reduced than a difference G2 in FIG. 7. As a result, when a difference between a voltage of the channel Cha of the selected memory cell string 230 and a gate voltage of the memory cell 231 is reduced, hot carrier injection may be reduced.

FIGS. 11A to 11D are graphs for describing a soft erase operation in detail, according to an embodiment.

Figure 11A:
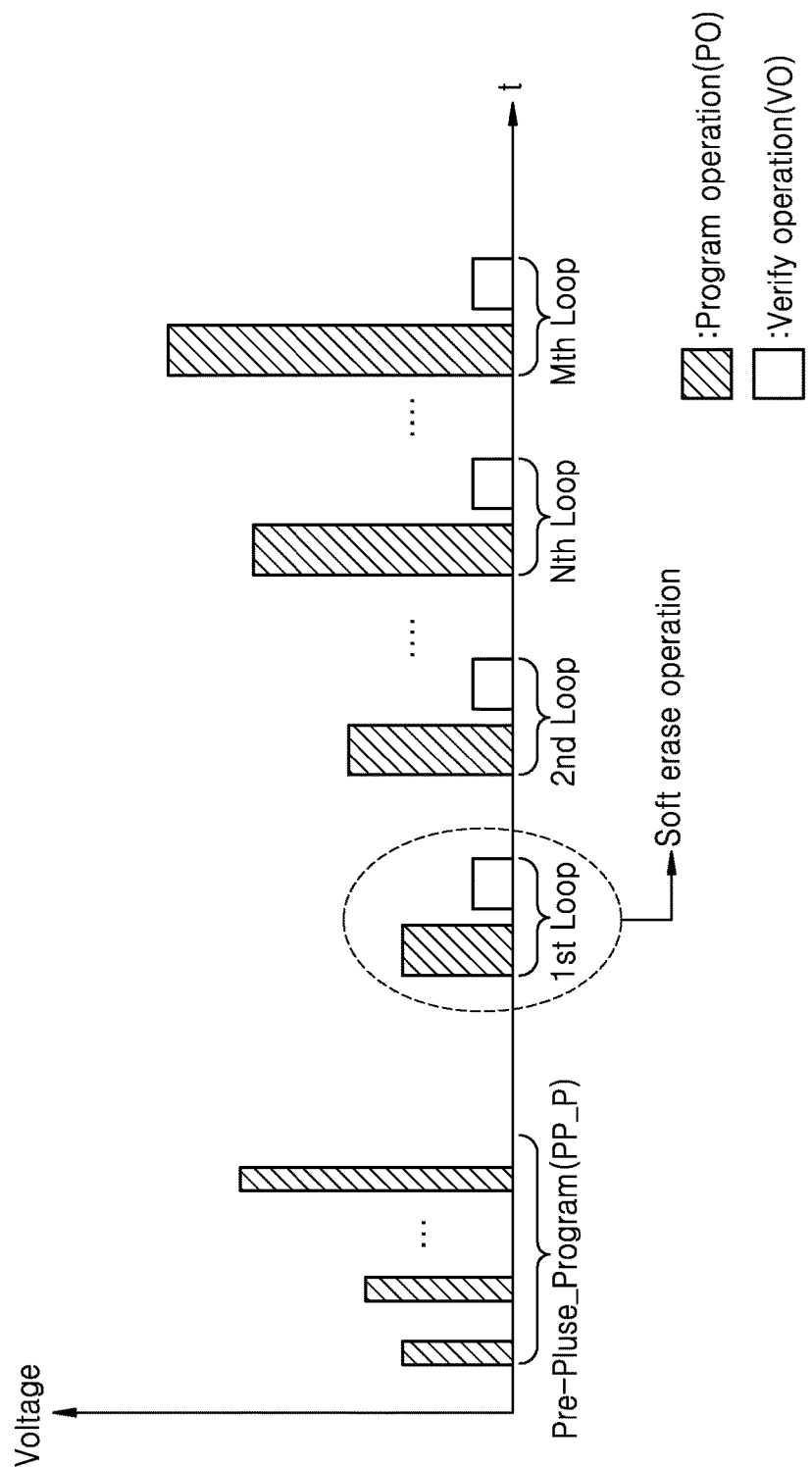
FIGS. 11A to 11D are diagrams for specifically describing a soft erase operation, according to an embodiment.

Referring to FIG. 2 and FIG. 11A, the control logic 110 may perform a pre-pulse program PP_P operation may be performed on memory cells including memory cells that are included in selected strings connected to the unselect bit line of the memory cell array 160 and connected to selected word lines when a plurality of program loops 1st Loop to Mth Loop are performed to program the select memory cells selected as a program object among the memory cell of the memory cell array 160 into a Nth programming state. The pre-pulse program PP_P may be defined into a program operation that is performed before performing the program loops to raise threshold voltages of the memory cells to a voltage range that corresponds to an expected programming state when the memory cells are expected to be programmed into a certain programming state. In one embodiment, the pre-pulse program PP_P may not include a separate verifying operation.

Figure 11B:
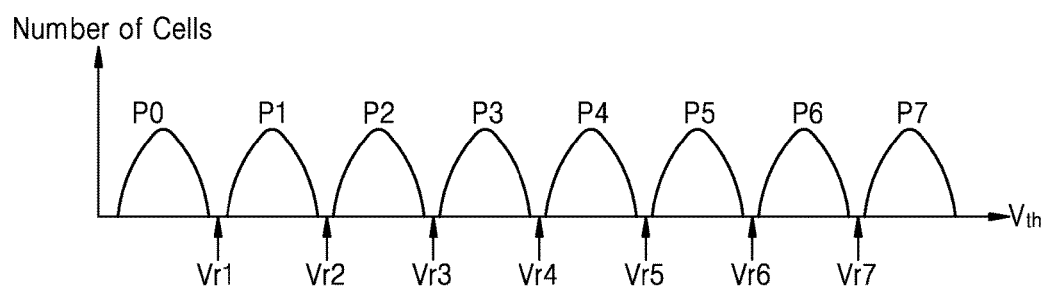

Referring to FIG. 11B, the memory cell is a triple level cell (TLC) in which 3-bit data is stored that may be programmed into an erase state E or to one of first to seventh programming states P1 to P7. The inventive concept may be applied to a multi level cell (MLC) in which 2-bit or 3-bit or higher data is stored. Further referring to FIG. 11C, when the first memory cell is scheduled to be programmed to a seventh programming state P7, a pre-pulse program PP_P operation for the first memory cell is performed to set a threshold voltage of the first memory cell to a threshold voltage range R7 corresponding to the seventh programming state P7. That is, by performing the pre-pulse program PP_P operation, threshold voltage distributions Pre_P1 to Pre_P7 for the memory cells scheduled to be programmed to the first to seventh programming states P1 to P7 may be pre-formed before performing the program loops.

Referring back to FIG. 2 and FIG. 11A, the soft-erase controller 116 may select at least one program loop among a plurality of program loops 1st Loop to Mth Loop and selectively control a soft erase operation in the selected program loop. Further, the soft-erase controller 116 may select some of the plurality of programming states and may selectively control a soft erase operation to be performed in a plurality of program loops for programming the memory cells with the selected programming states. For example, when a pre-pulse PP_P operation is performed on memory cells scheduled to be programmed in the second to seventh programming states P2 to P7 by the control logic 110, the soft-erase controller 116 may control that a soft erase operation may be performed in the first program loop 1st Loop among a plurality of program loops 1st Loop to Mth Loop for programming memory cells in the first programming state P1.

Figure 11C:
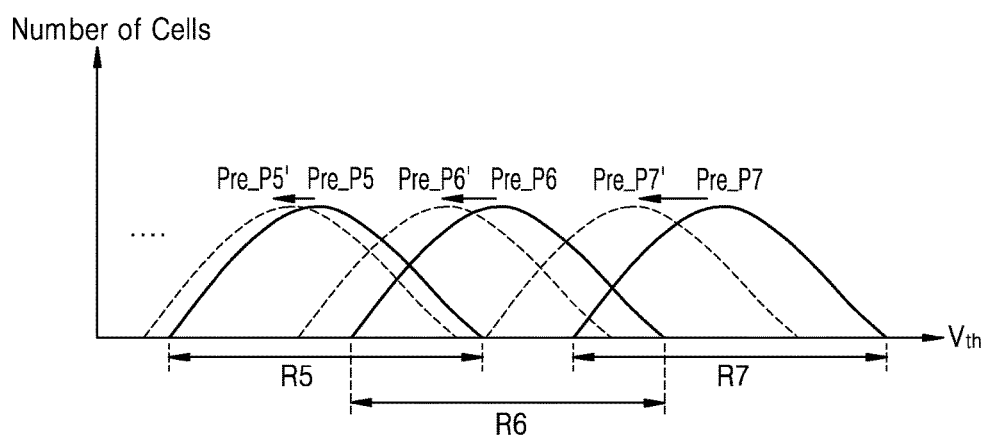
Figure 11D:
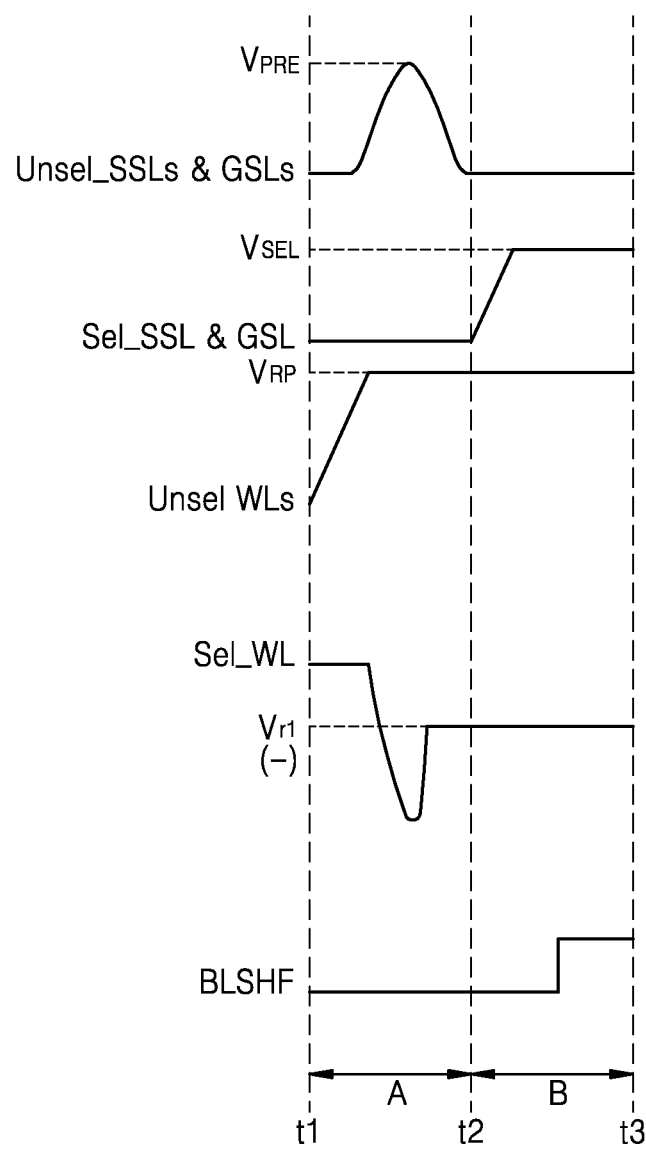

In particular, Referring to FIG. 5 and FIG. 11D, in the program operation PO interval of the first program loop 1st Loop, a voltage for programming the memory cells in the first programming state P1 in the selected word line Sel_WL and then apply a negative read voltage $V_{r1}$ to the selected word line Sel_WL to verify the programming state in the first verification interval A among the verify operation VO intervals. Also, as described above, the soft erase operation may be performed by applying the pre-pulse $V_{PRE}$ in the first verification interval A. As a result, as shown in FIG. 11C, by removing unstably trapped charges, the threshold voltage distributions Pre_P2 to Pre_P7 may be shifted to have a lower threshold voltage distributions Pre_P2' to Pre_P7'. When ideal threshold voltage distributions are formed, a reading performance may be improved.

FIGS. 11A to 11D are exemplary embodiments of the present disclosure, which is not limited thereto, and a soft erase operation may be controlled by using variety of methods according to the conditions under which the pre-pulse program PP_P.

Figure 12:
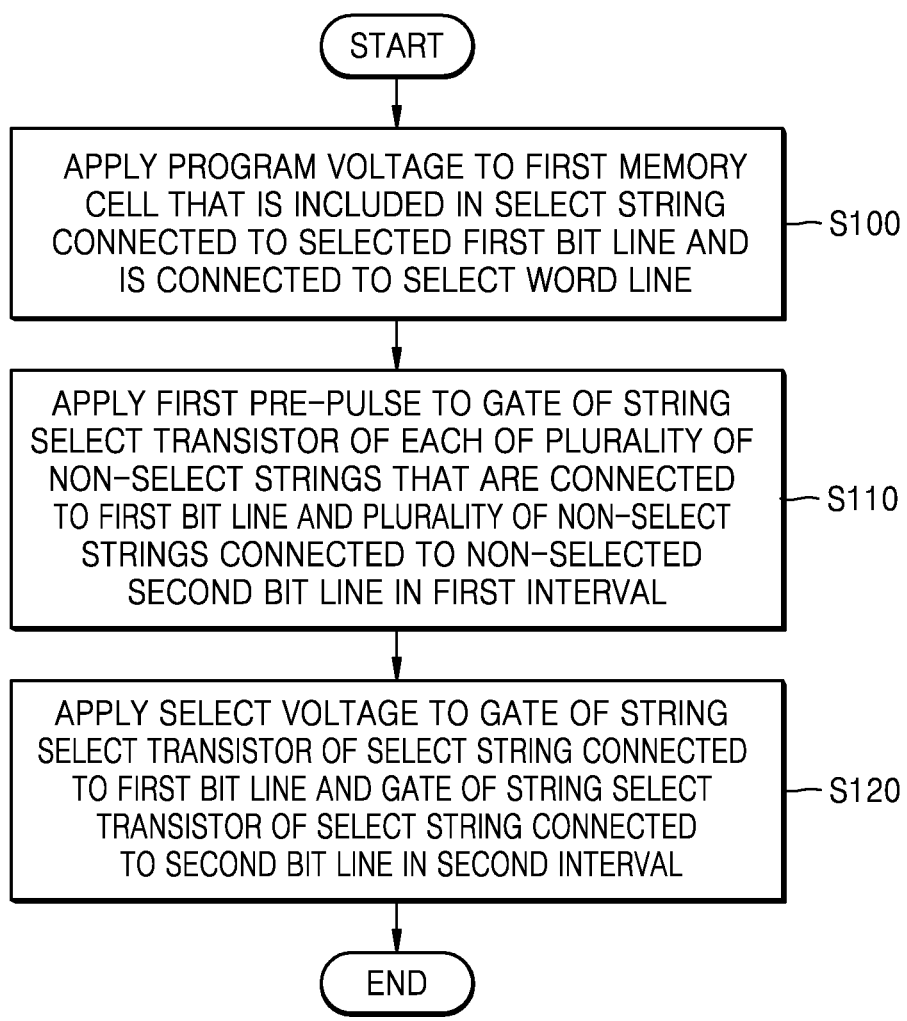
FIG. 12 is a flowchart for illustrating a method of performing a soft erase operation, according to an embodiment.

FIG. 12 is a flowchart illustrating a method of performing a soft erase operation according to an embodiment.

Referring to FIG. 12, a program voltage may be applied to a first memory cell that is included in a selected memory cell string connected to a first bit line selected in one program loop and is connected to a selected word line (S100). Thereafter, in the first verification interval, a read voltage for verifying the programming state of the first memory cell is applied to the selected word line, and a first pre-pulse may be applied to a gate of a string select transistor of each of a plurality of unselected memory cell strings connected to the first bit line and a gate of a string select transistor of each of a plurality unselected memory cell strings connected to the second bit line unselected (S110). In this regard, in the first verification interval, the second memory cell that is included in the selected memory cell string connected to the second bit line and is connected to the selected word line may be soft-erased. Then, in the second verification interval, a selection voltage may be applied to a gate of a string select transistor of the selected memory cell string connected to the first bit line and a gate of a string select transistor of the selected memory cell string connected to the second bit line, and thus a programming state of the first memory cell may be verified (S120).

Figure 13:
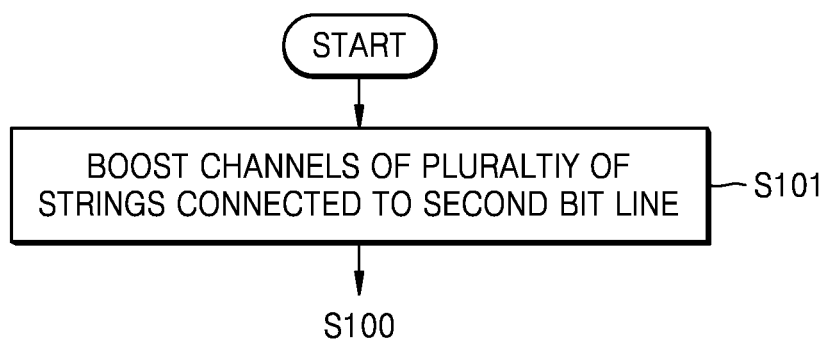
FIG. 13 is a flowchart for illustrating a method of performing a soft erase operation, according to an embodiment.

FIG. 13 is a flowchart that illustrates a method of performing a soft erase operation, according to an embodiment.

Referring to FIG. 13, channels of a plurality of strings connected to the second bit line may be boosted before performing S100 (S101). For example, channels of a plurality of strings connected to the second bit line may be boosted by performing a pre-pulse program operation on memory cells including the second memory cell that is included in the selected memory cell string among a plurality of strings connected to the second bit line and is connected to the selected word line.

Figure 14A:
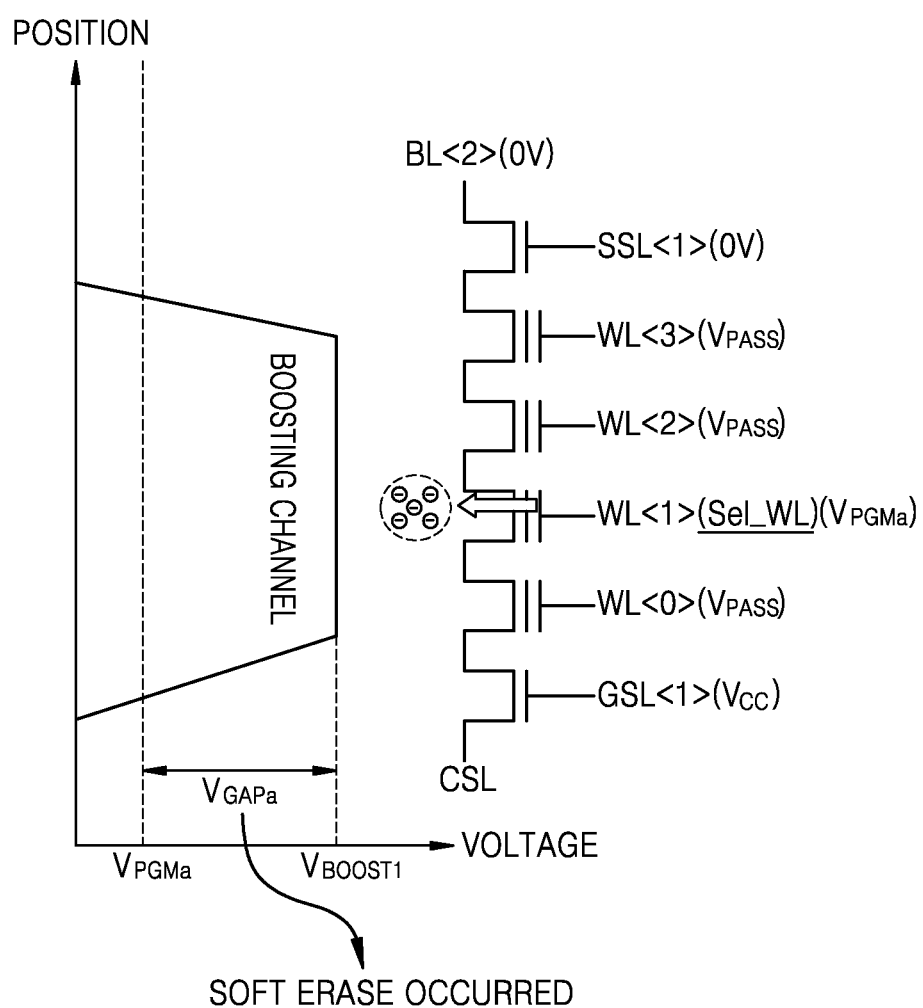
FIGS. 14A and 14B are diagrams for illustrating an operating mechanism for controlling a pre-pulse operation based on a program voltage level, according to an embodiment.
Figure 14B:
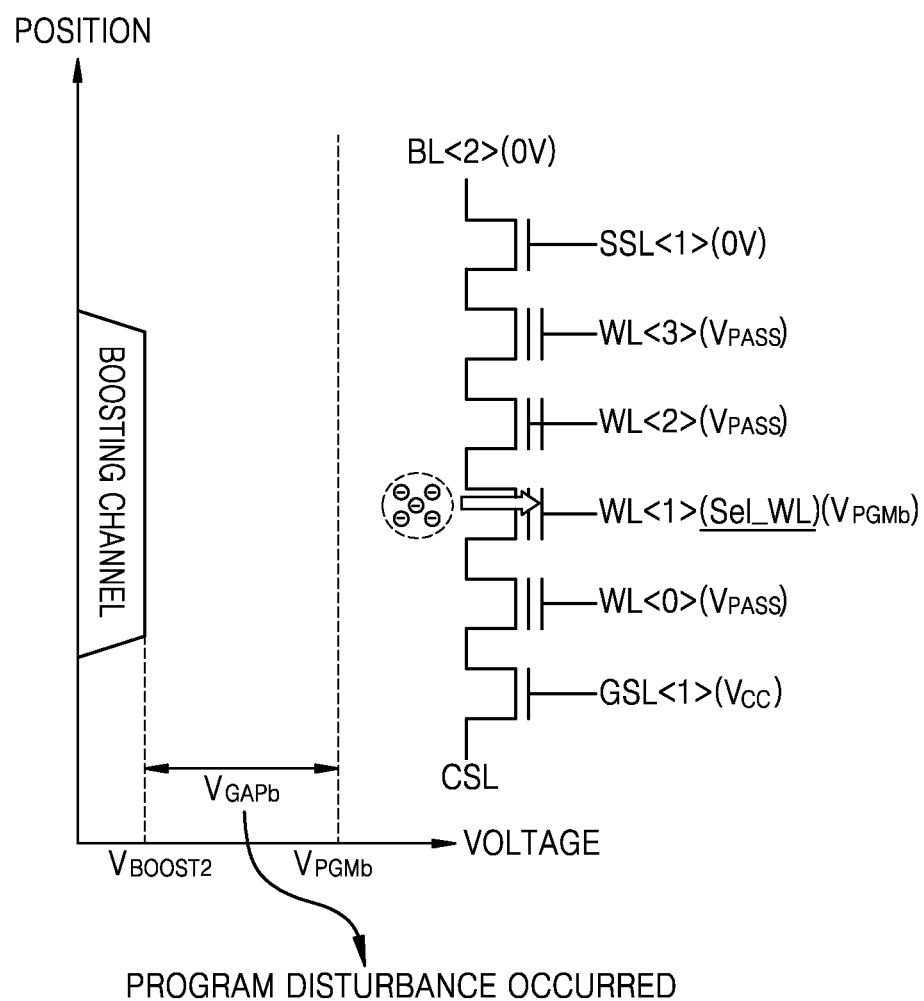

FIGS. 14A and 14B are diagrams for explaining operating mechanism of a pre-pulse operation based on the program voltage level, according to an embodiment.

First, referring to FIG. 2 and FIG. 5, the pre-pulse controller 114 may select some of the program loops 1st Loop to Mth Loop and apply a pre-pulse Pre-Pulse via string select lines $SSL_b$ connected to unselected memory cell strings in the selected program loops to remove charges of a boosting channel of each of the unselected memory cell strings. However, in FIG. 14A, it is assumed that the pre-pulse controller 114 does not perform the pre-pulse operation as described above, and, in FIG. 14B, it is assumed that the pre-pulse controller 114 performs a pre-pulse operation to all the program loops 1st Loop to Mth Loop.

Referring to FIGS. 5 and 14A, when a program loop is performed, a voltage of 0 V may be applied to a selected bit line BL<2>, a voltage of 0 V may be applied to a string select line SSL<1> connected to the unselected memory cell string 320, a pass voltage $V_{PASS}$ may be applied to the unselected word lines WL<0>, WL<2>, and WL<3>, and a program voltage $V_{PGMa}$ lower than a reference voltage level may be applied to a gate of the memory cell that is included in the unselected memory cell string 320 connected to the selected bit line BL<2> and is connected to the selected word lines WL<1> and Sel_WL. Here, as described above, since a voltage $V_{BOOST1}$ of a channel of the unselected memory cell string 320 is a predetermined voltage level or higher and a difference $V_{GAPa}$ between the voltage $V_{BOOST1}$ of a channel of the unselected memory cell string 320 and a program voltage $V_{PGMa}$ exceeds a predetermined level due to the pre-pulse operation, soft erase may occur in which charges trapped in the memory cell that is included in the unselected memory cell string 320 connected to the selected bit line BL<2> and is connected to the selected word lines WL<1> are removed in a channel direction of the unselected memory cell string 320. This may become a factor that causes read disturbance. Thus, a pre-pulse operation is needed to prevent the read disturbance.

Referring to FIGS. 7 and 14B, when a program loop is performed, a voltage of 0 V may be applied to a selected bit line BL<2>, a voltage of 0 V may be applied to a string select line SSL<1> connected to the unselected memory cell string 320, a power voltage $V_{CC}$ may be applied to a ground select line GSL<1> connected to the unselected memory cell string 320, a pass voltage $V_{PASS}$ may be applied to the unselected word lines WL<0>, WL<2>, and WL<3>, and a program voltage $V_{PGMb}$ higher than a reference voltage level may be applied to a gate of the memory cell that is included in the unselected memory cell string 320 connected to the selected bit line BL<2> and is connected to the selected word lines WL<1>. As described above, since a voltage $V_{BOOST2}$ of a channel of the unselected memory cell string 320 is set relatively lower than that in FIG. 14A and a difference $V_{GAPb}$ between the voltage $V_{BOOST2}$ of a channel of the unselected memory cell string 320 and a program voltage $V_{PGMb}$ exceeds a predetermined level due to the pre-pulse operation, charges of a channel of the unselected memory cell string 320 may be injected in a direction of the memory cell that is included in the unselected memory cell string 320 connected to the selected bit line BL<2> and is connected to the selected word line WL<1> are removed in a channel direction of the unselected memory cell string 320. This may become a factor that causes read disturbance. Thus, a pre-pulse operation needs to be limited to prevent the read disturbance.

Figure 15:
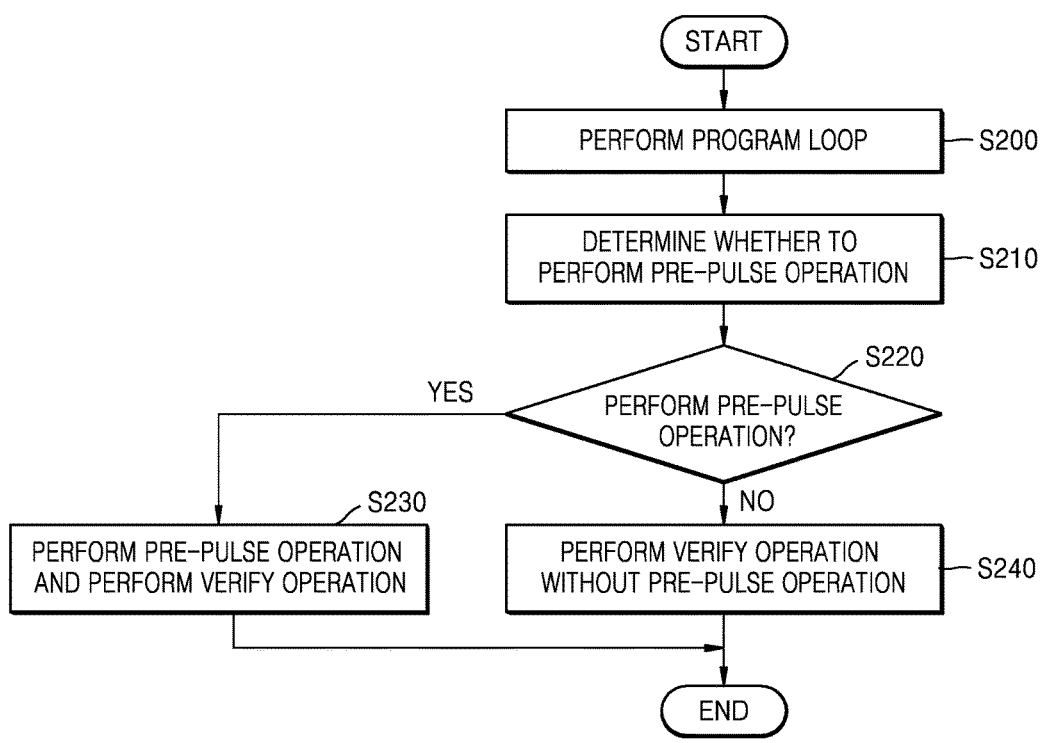
FIG. 15 is a flowchart for illustrating a method of controlling a pre-pulse operation based on a program voltage level, according to an embodiment.

FIG. 15 is a flowchart illustrating a method of controlling a pre-pulse operation based on a program voltage level, according to an embodiment.

Referring to FIG. 15, a program loop may be started to apply a program voltage to selected memory cells in a program interval (S200). It is possible to determine whether to perform the pre-pulse operation after the program interval based on the program voltage level in the program interval (S210). If it is determined to perform the pre-pulse operation (S220, YES), the pre-pulse operation and the verify operation for verifying the programming state of the selected memory cells may be performed (S230). If it is determined not to perform the pre-pulse operation (S220, NO), the pre-pulse operation can be skipped and the verification operation can be performed (S240). According to an embodiment, the program voltage in the program interval may be one reflecting a temperature of the memory device and the corresponding offset during performing of the program loop, and the reference voltage level that is used when determining whether the pre-pulse operation would be performed may also reflect a temperature of the memory device and the corresponding offset, as well as the program voltage does.

Figure 16A:
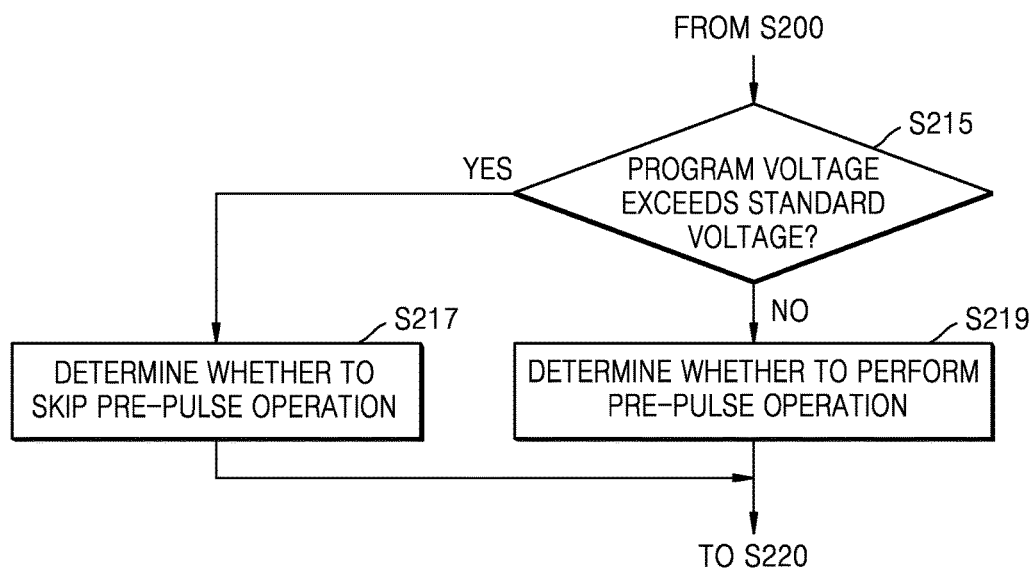
FIGS. 16A to 16C are flowcharts for illustrating a method of controlling a pre-pulse operation based on various criteria, according to an embodiment.
Figure 16B:
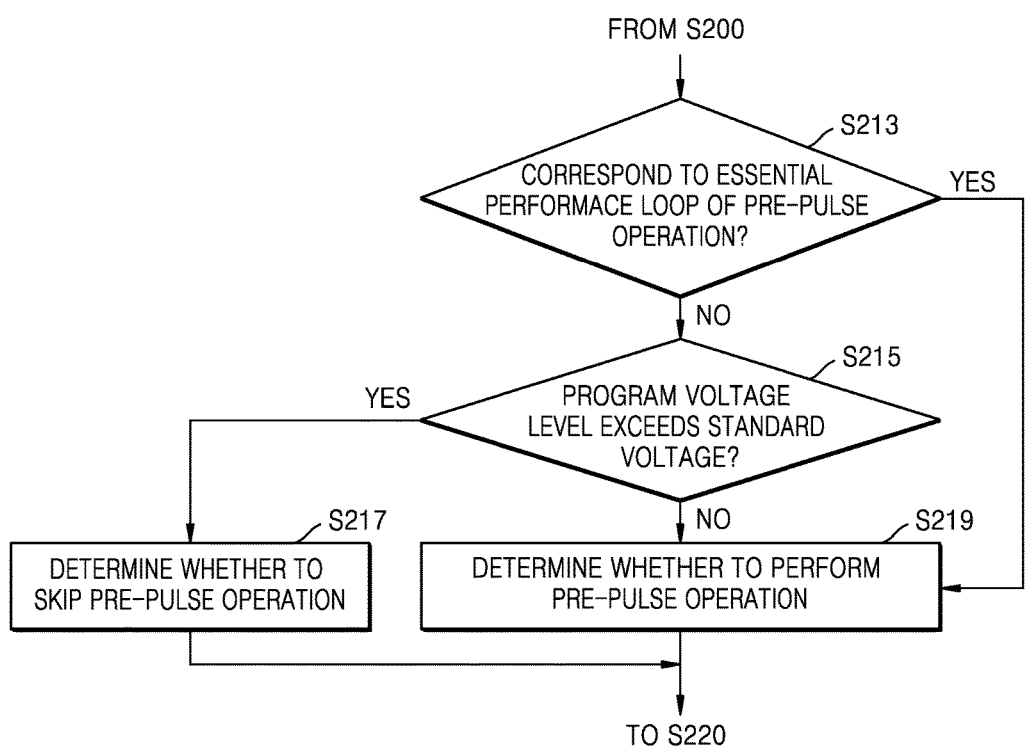

FIGS. 16A to 16B are flowcharts illustrating a method of controlling a pre-pulse operation based on various criteria, according to an embodiment.

Referring to FIG. 16A, after step S200 in FIG. 15, whether the program voltage level in the program interval exceeds the reference voltage level may be determined to perform the pre-pulse operation (S215). When the program voltage level exceeds the reference voltage level (S215, YES), it can be determined to skip the pre-pulse operation (S217). When the program voltage level is lower than the reference voltage level (S215, NO), it can be determined to perform the pre-pulse operation (S219). Thereafter, step S220 in FIG. 15 may be performed. In particular, by further referring to FIG. 2, when the program voltage level is equal to or lower than the reference voltage level, the pre-pulse controller 114 may perform the pre-pulse operation such that the difference $V_{GAPa}$ between the voltage $V_{BOOST1}$ of the channel of the unselected memory cell string 320 and the program voltage $V_{PGMa}$ described in FIG. 14A does not exceed a predetermined level, and thus the voltage $V_{BOOST1}$ of the channel of the unselected memory cell string 320 may be decreased. When the program voltage level exceeds the reference voltage level, the pre-pulse controller 114 may skip the pre-pulse operation such that the difference $V_{GAPb}$ between the voltage $V_{BOOST2}$ of the channel of the unselected memory cell string 320 and the program voltage $V_{PGMb}$ described in FIG. 14B does not exceed a predetermined level, and thus the voltage $V_{BOOST2}$ of the channel of the unselected memory cell string 320 may be increased.

Referring to FIG. 16B, the method may further include step S213 of determining whether a program loop that starts the performance in FIG. 15 corresponds to a pre-pulse required loop. When the program loop corresponds to the pre-pulse required loop (S213, YES), it can be determined to perform the pre-pulse operation regardless of the program voltage level (S219). When the program loop does not correspond to the pre-pulse required loop (S213, NO), step S215 can be performed.

Figure 16C:
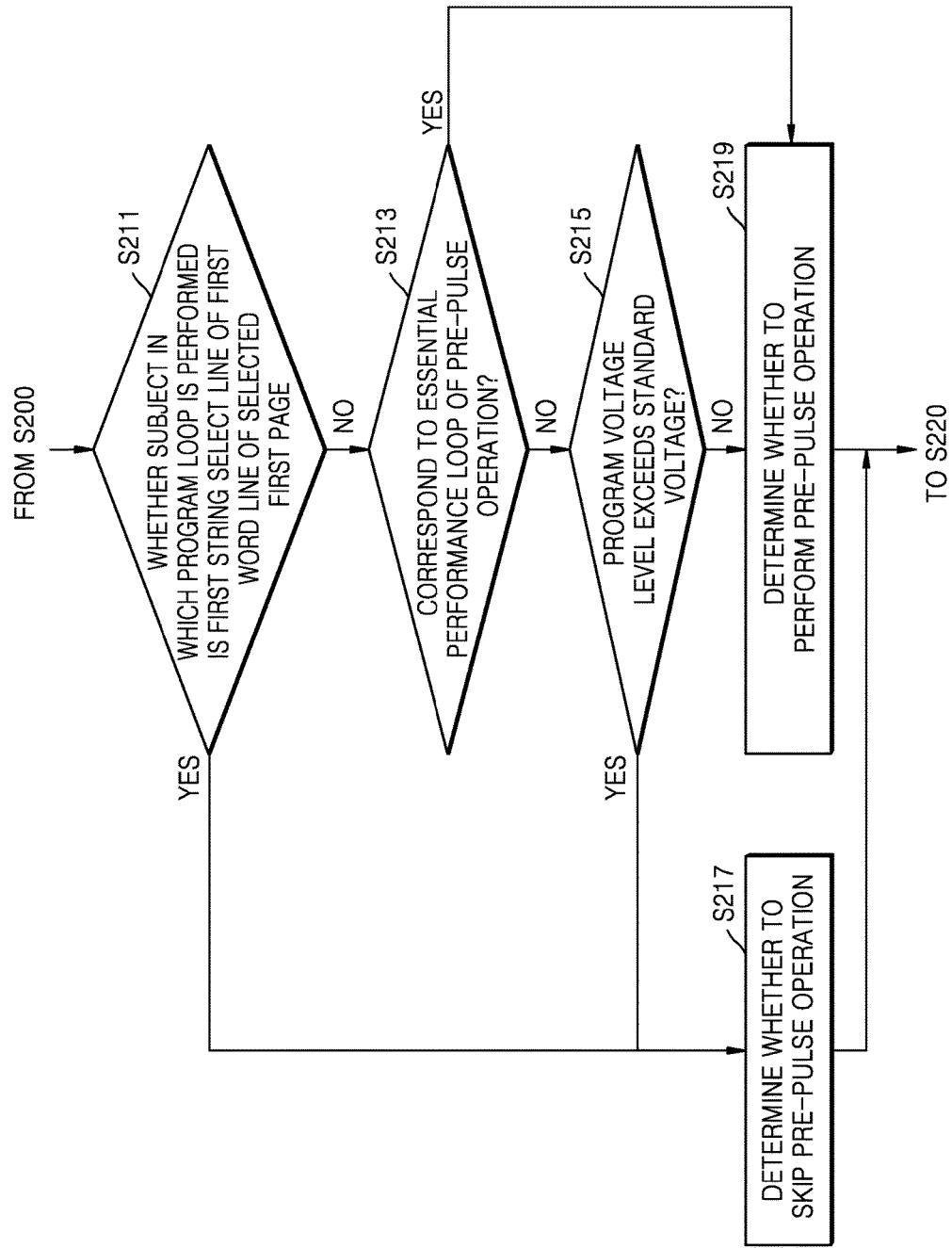

Referring to FIG. 16C, the method may further include step S211 of determining whether an object to be program-looped in a memory block of the erased state is a first string selection line in a first word line of a selected first page, as compared with FIG. 16B. That is, the memory cells except the memory cells in which the program loop is performed are all erased, so soft erase is not generated even if the pre-pulse operation is performed as shown in FIG. 14A. Therefore, it is the first string selection line in the first word line of the first page selected as the object to be program-looped in the memory block in the erased state (S211, YES), the pre-pulse operation may be determined to be skipped (S217). If the memory block in the erased state is not the first string selection line in the first word line of the first page selected as the object to be program-loop (S211, NO), step S213 may be performed.

Figure 17:
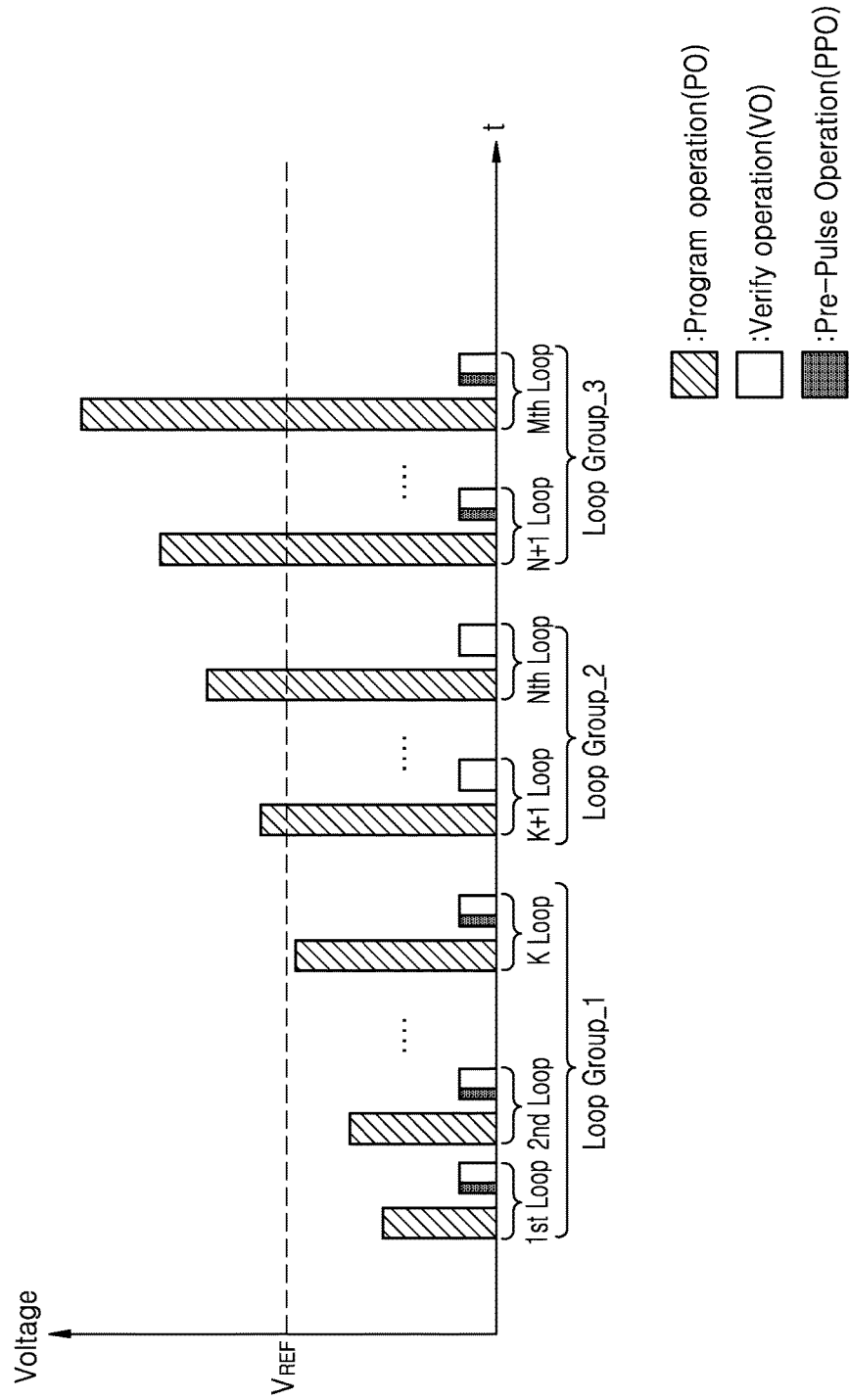
FIG. 17 is a diagram for illustrating a method of controlling a pre-pulse operation, according to an embodiment.

FIG. 17 is a graph illustrating a method of controlling a pre-pulse operation, according to an embodiment.

Referring to FIGS. 2, 5, and 17, the control logic 110 may perform the plurality of program loops 1st Loop to Mth Loop on the selected memory cells, and the pre-pulse controller 114 may control a pre-pulse operation (Pre-Pulse Operation PPO) on the unselected memory cell strings 310, 320, and 340 of the selected bit line BL<2> based on a program voltage level of each of the program loops 1st Loop to Mth Loop. For example, when a program voltage level of each of the program loops 1st Loop to Mth Loop is equal to or lower than the reference voltage $V_{REF}$ level, the pre-pulse controller 114 may determine that the unselected memory cell strings 310, 320, and 340 of the selected bit line BL<2> to perform the Pre-Pulse operation PPO. That is, the pre-pulse controller 114 may perform the Pre-Pulse operation PPO on the unselected memory cell strings 310, 320, and 340 of the selected bit line BL<2> in the program loops 1st Loop to Kth Loop included in a first program loop group Loop Group_1 that performs a program operation by using a program voltage that is equal to or lower than a level of the reference voltage $V_{REF}$.

In one embodiment, when the program voltage level of each of the program loops 1st Loop to Mth Loop exceeds the reference voltage $V_{REF}$, the pre-pulse controller 114 may skip performing the Pre-Pulse operation PPO on the unselected memory cell strings 310, 320, and 340 of the selected bit line BL<2>. That is, the Pre-Pulse operation PPO of the unselected memory cell strings of the selected bit line BL<2> may be skipped in program loops K+1th Loop to Nth Loop included in a second program loop group Loop Group_2 that performs a program operation by using a program voltage exceeding a level of the reference voltage $V_{REF}$.

In another embodiment, the pre-pulse controller 114 may perform the Pre-Pulse operation PPO on the unselected memory cell strings 310, 320, and 340 of the selected bit line BL<2> in program loops N+1th Loop to Mth Loop included in a third program loop Loop Group_3, which is set as pre-pulse required loops. The pre-pulse controller 114 may receive a setting signal from the outside, may set a pre-pulse required loop based on the setting signal, and may store setting information thus generated in a part of the memory cell array 160.

Figure 18A:
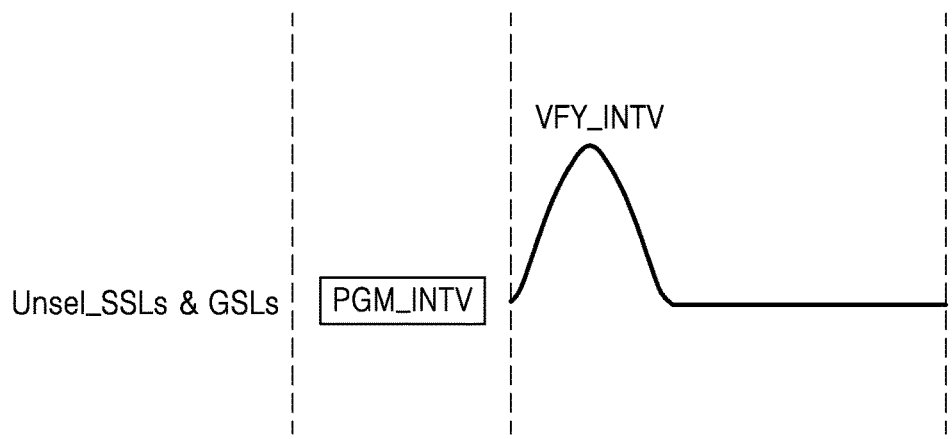
FIGS. 18A and 18B are diagrams for illustrating a pre-pulse period where a pre-pulse operation is performed, according to an embodiment.
Figure 18B:
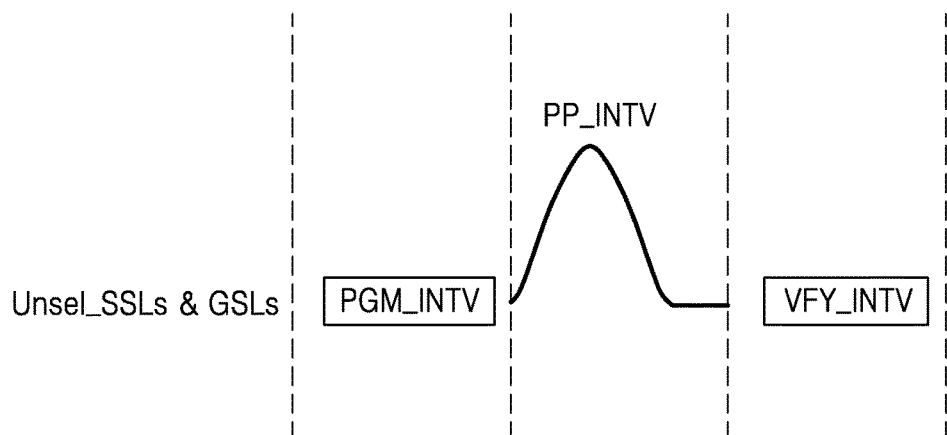

FIGS. 18A and 18B are diagrams for explaining a pre-pulse interval in which a pre-pulse operation according to an embodiment is performed.

Referring to FIG. 18A, one program loop may include a program interval PGM_INTV and a verification interval VFY_INTV, and a pre-pulse interval between the program interval PGM_INTV and the verification interval VFY_INTV is set so that the pre-pulse operation can be performed.

Referring to FIG. 18B, one program loop may include a program interval PGM_INTV and a verification interval VFY_INTV, and a pre-pulse interval PP_INTV is set in the verification interval VFY_INTV.

Figure 19:
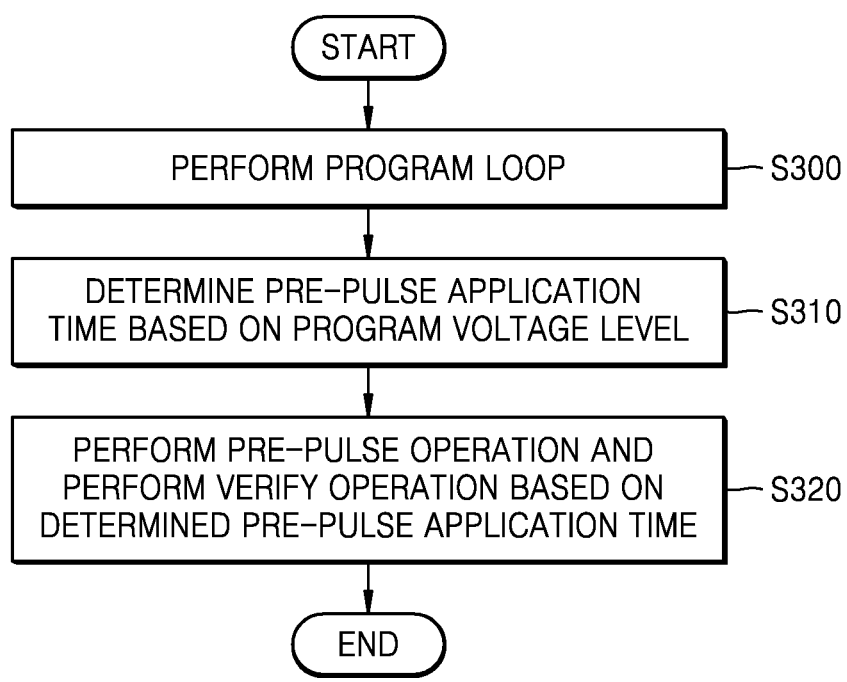
FIG. 19 is a flowchart for illustrating a method of controlling a pre-pulse operation based on a program voltage level, according to an embodiment.

FIG. 19 is a flowchart illustrating a method of controlling a pre-pulse operation based on a program voltage level, according to an embodiment.

Referring to FIG. 19, an operation of a program loop may be started to apply a program voltage to selected memory cells in a program interval (S300). After the program interval, an application time of a pre-pulse can be determined, wherein the application time for the pre-pulse operation being performed on the unselected memory cell strings based on the program voltage level in the program interval (S310). The pre-pulse operation can be performed on the unselected memory cell strings based on the determined pre-pulse sending time, and a verify operation for verifying a programming state of the selected memory cells can be performed (S320). In particular, referring to FIG. 2, when the program voltage level is higher, the pre-pulse controller 114 shortens the application time of the pre-pulse when the pre-pulse operation is performed and reduces an amount of charges that are removed in a channel of the unselected memory cell strings, and thus the difference $V_{GAPb}$ between the voltage $V_{BOOST2}$ of the channel of the unselected memory cell string 320 and the program voltage $V_{PGMb}$ described above in FIG. 14B may be controlled not to exceed a predetermined level. That is, in terms of performing a plurality of program loops, the pre-pulse controller 114 may shorten the application time of the pre-pulse as the program proceeds to upper loops. As a result, when the program loops of certain number of loops or more are performed, the pre-pulse operation may be skipped.

Figure 20A:
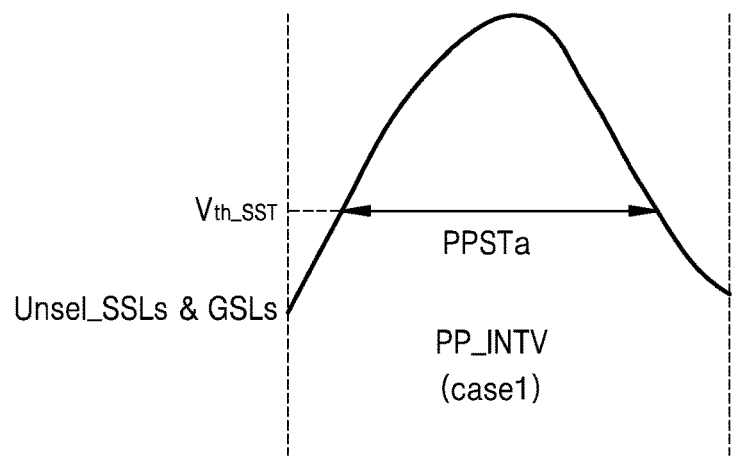
Figure 20B:
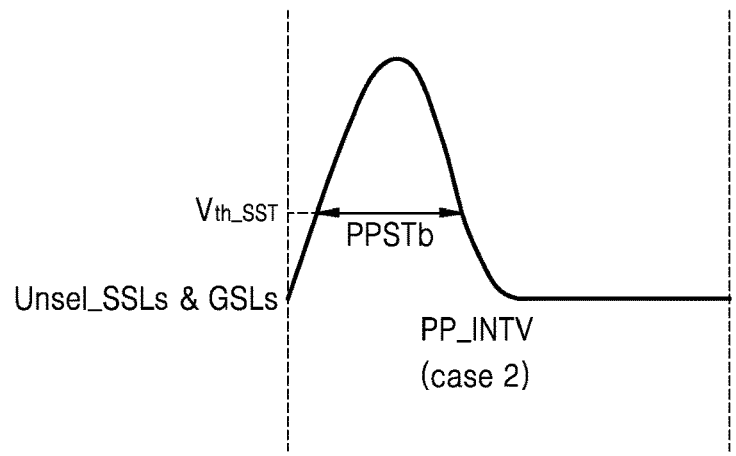

FIGS. 20A, 20B, and 20C are diagrams illustrating a method of determining and controlling an application time of a pre-pulse based on a program voltage level, according to an embodiment.

Referring to FIGS. 2, 5, and 20A, the pre-pulse controller 114 may determine a pre-pulse sending time PPST during which a pre-pulse is sent to a gate of a string select transistor and a gate of a ground select transistor included in the unselected memory cell strings 310, 320, and 340 of the selected bit line BL<2> via the unselected memory cell string select lines and unselected ground select lines Unsel SSLs & GSLs based on a program voltage level. For example, when the program voltage level is a first level (Case 1), the pre-pulse controller 114 control a pre-pulse to be sent to the gate of the string select transistor and the gate of the ground select transistor included in the unselected memory cell strings 310, 320, and 340 of the selected bit line BL<2> via the unselected memory cell string select lines and unselected ground select lines Unsel SSLs & GSLs during a first pre-pulse sending time PPSTa in a pre-pulse interval PP_INTV. The pre-pulse sending time PPST may denote a time during which a pre-pulse of a threshold voltage of a gate of a string select transistor $V_{th\_SST}$ or a threshold voltage level of a gate of a ground select transistor or higher is sent to activate the gate of the string select transistor or the ground select transistor.

Referring to FIGS. 2, 5, and 20B, when the program voltage level is a second level that is higher than a first level (Case 2), the pre-pulse controller 114 may control a pre-pulse to be sent to the gate of the string select transistor and the gate of the ground select transistor included in the unselected memory cell strings 310, 320, and 340 of the selected bit line BL<2> via the unselected memory cell string select lines and unselected ground select lines Unsel SSLs & GSLs during a second pre-pulse sending time PPSTb, which is shorter than the first pre-pulse sending time PPSTa, in the pre-pulse interval PP_INTV.

Referring to FIGS. 2 and 20C, the pre-pulse controller 114 may determine a pre-pulse sending time PPST for performing a pre-pulse operation on the unselected memory cell strings based on a program voltage level PVL by referring to a table Table showing the program voltage level PVL and the pre-pulse sending time PPST mapped thereon. For example, when the program voltage level PVL is a first level Lev_1, the pre-pulse sending time PPST may be a first time T_1. Also, when the program voltage level PVL is an H level Lev_H, the pre-pulse sending time PPST may be an H time T_H. The information in the table Table may be stored in a predetermined part of the memory cell array 160, and the table Table may be updated based on information received from the outside.

Figure 21:
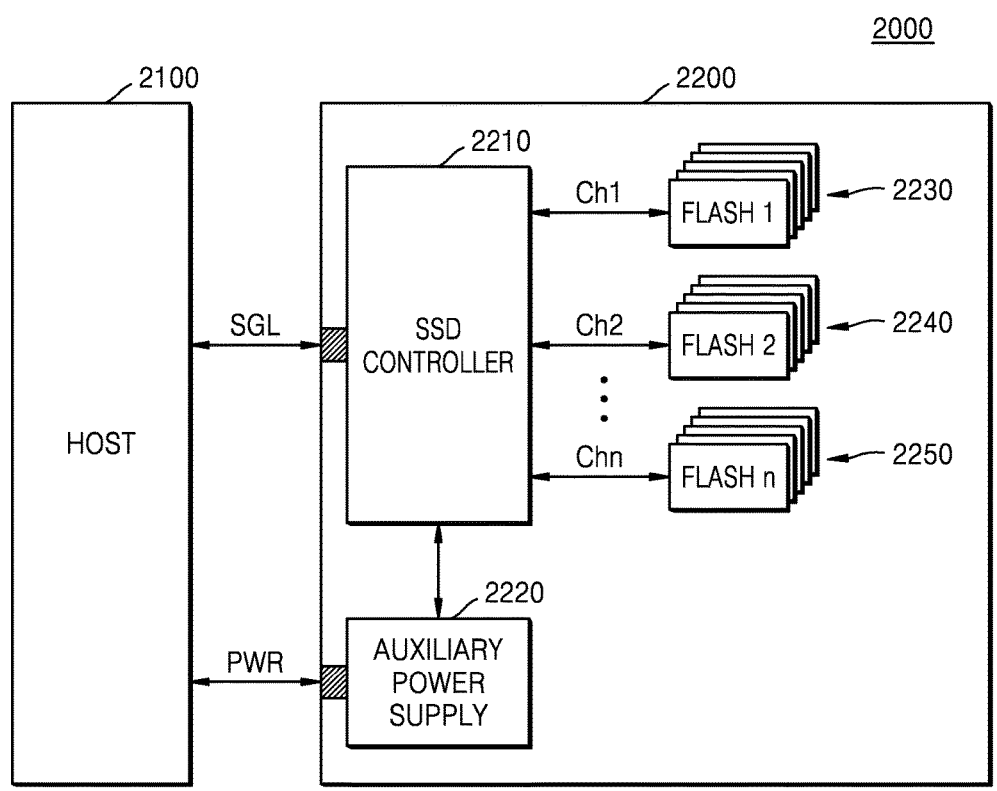
FIG. 21 is a block diagram illustrating a solid state disk (SSD) system according to an embodiment.

FIG. 21 is a block diagram illustrating an SSD system 2000, according to an embodiment.

Referring to FIG. 21, the SSD system 2000 may include a host 2100 and an SSD 2200. The SSD 2200 exchanges signals with the host 2100 through a signal connector and receives power through a power connector. The SSD 2200 may include an SSD controller 2210, an auxiliary power device 2220, and a plurality of memory devices 2230, 2240 and 2250. Here, the SSD 2200 may be implemented using the embodiments shown in FIGS. 1 to 20C.

In particular, when the plurality of memory devices 2230 to 2250 perform a plurality of program loops, performing a pre-pulse operation on the unselected memory cell strings in each of the program loops is controlled based on the program voltage level. Also, the plurality of memory devices 2230 to 2250 may select at least one from the plurality of program loops and may perform a soft erase operation on memory cells including memory cells that are included in selected memory cell strings connected to an unselect bit line in the program loop and are connected to a selected word line.

Memory cards, nonvolatile memory devices, and card controllers according to an embodiment may be implemented in the SSD system 2000 by using various types of packages. For example, a flash memory device and/or a memory controller according to an embodiment may be implemented in the SSD system 2000 by using a package such as a package on package (PoP), ball grid arrays (BGAs), chip scale packages (CSPs), plastic leaded chip carriers (PLCCs), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline integrated circuit (SOIC), shrink small outline package (SSOP), thin small outline package (TSOP), system in package (SIP), multi chip package (MCP), wafer-level fabricated package (WFP), or wafer-level processed stack package (WSP).

While the inventive concept has been particularly shown and described with reference to embodiments thereof, it will be understood that various changes in form and details may be made therein without departing from the spirit and scope of the following claims.

What is claimed is:

1. A soft erase method of a nonvolatile memory device including a three-dimensional memory cell array, the three-dimensional memory cell array including a plurality of memory cell strings, each memory cell string including a string select transistor, a plurality of memory cell transistors and a ground select transistor vertically stacked on a silicon substrate, and each memory cell string are connected to a bit line and a common source line respectively, the method comprising;

performing a plurality of program loops to program a first memory cell into a first programming state, the first programming state being one of N programming states of the first memory cell, and the first memory cell is associated with a selected memory cell string connected to a selected first bit line and a selected word line respectively;

at least one of the plurality of program loops comprises,
performing a soft erase operation on a second memory cell during a first interval, the second memory cell is associated with an unselected memory cell string which is connected to the selected bit line and the selected word line respectively, the soft erase operation being performed by applying a first pre-pulse to a gate of a string select transistor of the unselected memory cell string; and performing a verifying operation on the first memory cell during a second interval, the verifying operation being performed by applying a turn on voltage to a gate of string select transistor of the selected memory cell string.

2. The soft erase method of claim 1, further comprising boosting a channel of each of the plurality of memory cell strings connected to an unselected second bit line.

3. The soft erase method of claim 2, wherein the boosting of the channel of each of the plurality of memory cell strings connected to the unselected second bit line comprises performing a pre-pulse program operation on a plurality of memory cells each including the second memory cell that is included in the selected memory cell string connected to the unselected second bit line and is connected to the selected word line.

4. The soft erase method of claim 3, wherein the second memory cell is predetermined to be in a second programming state having a threshold voltage level that is higher than that of the first programming state of the first memory cell.

5. The soft erase method of claim 1, wherein the plurality of the memory cells included in the each memory cell array are multi-level cells,
the Nth programming state is a first programming state, and
the second memory cell is predetermined to be programmed according to the second programming state or a higher programming state.

6. The soft erase method of claim 1, wherein the applying of the first pre-pulse further comprises applying, in the first verification interval, a read pass voltage to a plurality of unselected word lines.

7. The soft erase method of claim 1, wherein the second intervals is later in time than the first interval.

8. The soft erase method of claim 1, wherein the soft erasing of the second memory cell further comprises applying, in the first interval, a second pre-pulse to a gate of a string select transistor of a selected memory cell string connected to the first bit line and a gate of the string select transistor of the selected memory cell string connected to the unselected second bit line so as to reduce hot carrier injection with respect to the second memory cell.

9. The soft erase method of claim 8, wherein the second pre-pulse has a voltage level that is lower than that of the first pre-pulse and/or a pulse width that is narrower than that of the first pre-pulse.

10. A programming method of a nonvolatile memory device comprising a 3-dimensional memory cell array,
wherein, when a plurality of program loops including an Nth (where N is a natural number of 1 or greater) program loop are performed to program a plurality of select memory cells that are included in a string connected to at least one selected bit line and are connected to a selected word line,
wherein the Nth program loop comprise;
applying a program voltage to the plurality of select memory cells;
controlling a pre-pulse operation for removing a plurality of boosting charges of a plurality of unselected strings connected to the select bit line, based on a program voltage level; and
performing a verify operation with respect to the plurality of select memory cells.

11. The programming method of claim 10, wherein controlling of a pre-pulse operation comprises:
determining to perform the pre-pulse operation when a program voltage level exceeds a reference voltage; and
applying a pre-pulse to a gate of a string, select transistor of each of a plurality of unselected memory cell strings connected to the selected bit line.

12. The programming method of claim 10, wherein controlling of a pre-pulse operation comprises determining to skip the pre-pulse operation when a program voltage level is a reference voltage level or lower.

13. The programming method of claim 10, wherein controlling of a pre-pulse operation comprises:
determining to perform the pre-pulse operation when an $N^{th}$ program loop corresponds to a pre-pulse required loop; and
applying a pre-pulse to a gate of a string select transistor of each of a plurality of unselected memory cell strings connected to the select bit line.

14. The programming method of claim 10, wherein the controlling of a pre-pulse operation comprises:
determining a pre-pulse application time based on a program voltage level; and
applying a pre-pulse based on the determined pre-pulse sending time to a gate of a string select transistor of each of the plurality of unselected memory cell strings connected to the selected bit line.

15. The programming method of claim 14, wherein the determining of the pre-pulse sending time comprises determining the pre-pulse sending time to be shorter as the program voltage level increases.

16. A soft erase method of a nonvolatile memory device including a three-dimensional memory cell array, the three-dimensional memory cell array including a plurality of memory cell strings, each memory cell string including a string select transistor, a plurality of memory cell transistors and a ground select transistor vertically stacked on a silicon substrate, and each memory cell string are couple to a bit line and a common source line respectively, the method comprising:
performing a program operation to program a first memory cell of a selected memory cell string which is connected to a bit line through a first string select transistor; and
performing a verifying operation on the memory cell, the verifying operation including:
applying a first pre-pulse on a gate of a second string select transistor of a unselected memory cell string, the unselected memory cell string is connected to the bit line through the second string select transistor during a first interval; and
applying a turn on voltage to a gate of the first string select transistor of the selected memory cell string during a second interval,
wherein, the second interval is later in time than the first Interval.

17. The soft erase method of claim 16, further comprising boosting a channel of each of the plurality of memory cell strings connected to an unselected bit line.

18. The soft erase method of claim 17, wherein the boosting of the channel of each of the plurality of memory cell strings connected to the unselected bit line comprises performing a pre-pulse program operation on a plurality of memory cells that is included in the unselected memory cell string.

19. The soft erase method of claim 18, wherein memory cells included in the each memory cell strings are multi-level cells.

20. The soft erase method of claim 19, wherein the soft erasing of the second memory cell further comprises applying, during the first interval, a second pre-pulse to a gate of a string select transistor of a selected memory cell string connected to a selected bit line so as to reduce hot carrier injection with respect to the second memory cell.

* * * * *